United States Patent
Leuenberger et al.

(10) Patent No.: US 12,176,868 B2
(45) Date of Patent: Dec. 24, 2024

(54) GAIN CALIBRATION FOR AUDIO AMPLIFIERS

(71) Applicant: SKYWORKS SOLUTIONS, INC., Irvine, CA (US)

(72) Inventors: Spencer David Leuenberger, Portland, OR (US); Deepika Kumari, Portland, OR (US); David Lamb, Portland, OR (US); Mark R. Peting, Yamhill, OR (US); Evan Michael Albright, Portland, OR (US); Wai Laing Lee, Portland, OR (US); Amit Kumar, Portland, OR (US)

(73) Assignee: Skyworks Solutions, Inc., Irvine, CA (US)

( * ) Notice: Subject to any disclaimer, the term of this patent is extended or adjusted under 35 U.S.C. 154(b) by 204 days.

(21) Appl. No.: 17/955,000

(22) Filed: Sep. 28, 2022

(65) Prior Publication Data

US 2023/0103164 A1 Mar. 30, 2023

Related U.S. Application Data

(60) Provisional application No. 63/250,137, filed on Sep. 29, 2021, provisional application No. 63/250,153, filed on Sep. 29, 2021.

(51) Int. Cl.
| | |
|---|---|
| *H03F 3/217* | (2006.01) |
| *H03F 3/183* | (2006.01) |
| *H03G 3/30* | (2006.01) |
| *H04R 1/10* | (2006.01) |
| *H04R 3/04* | (2006.01) |

(52) U.S. Cl.
CPC ........... *H03F 3/2175* (2013.01); *H03F 3/183* (2013.01); *H03G 3/3005* (2013.01); *H04R 1/1041* (2013.01); *H04R 3/04* (2013.01); *H03F 2200/03* (2013.01); *H03F 2200/351* (2013.01); *H03G 2201/103* (2013.01); *H04R 2201/028* (2013.01);
(Continued)

(58) Field of Classification Search
CPC ........... H03F 2200/03; H03F 2200/351; H03F 3/183; H03F 3/187; H03F 3/2173; H03F 3/2175; H04R 1/1041; H04R 2201/028; H04R 2420/07; H04R 2430/01; H04R 3/04; H04M 2250/12; H04M 3/5116; H04W 84/18; H03G 2201/103; H03G 3/3005
USPC ...................................... 381/120, 74; 700/94
See application file for complete search history.

(56) References Cited

U.S. PATENT DOCUMENTS 10,243,533 B1 * 3/2019 Berkhout ................ H03G 3/005
2006/0229028 A1 * 10/2006 Somayajula ........ H04M 1/6016
455/73

(Continued)

*Primary Examiner* — Lun-See Lao
(74) *Attorney, Agent, or Firm* — Chang & Hale LLP

(57) ABSTRACT

In some embodiments, a calibration circuit for an audio amplification system can include a tone generator configured to provide a tone having a frequency to an input path of an audio amplifier, such that an input signal provided to the audio amplifier includes the tone, a a first sampling circuit configured to sample an output signal at an output node of the audio amplifier, and a second sampling circuit configured to sample the input signal at an input node of the audio amplifier. The calibration circuit can further include a gain adjustment circuit configured to generate a correction signal based on the sampled output signal and the sampled input signal to correct for a gain variation of the audio amplifier.

16 Claims, 15 Drawing Sheets

(52) U.S. Cl.
CPC ...... *H04R 2420/07* (2013.01); *H04R 2430/01* (2013.01)

(56) References Cited

U.S. PATENT DOCUMENTS

| | | | |
|---|---|---|---|
| 2012/0288119 A1* | 11/2012 | Apfel | A61B 5/123 |
| | | | 381/101 |
| 2018/0124542 A1* | 5/2018 | Lermer | H04S 7/301 |
| 2020/0358472 A1* | 11/2020 | Sahu | H04B 1/04 |
| 2022/0286538 A1* | 9/2022 | Yang | H04R 3/00 |

* cited by examiner

GAIN CALIBRATION FOR AUDIO AMPLIFIERS

CROSS-REFERENCE TO RELATED APPLICATION(S)

This application claims priority to U.S. Provisional Application Nos. 63/250,137 filed Sep. 29, 2021, entitled HIGH OUTPUT RESISTANCE MODE GAIN CALIBRATION FOR AUDIO AMPLIFIERS, and 63/250,153 filed Sep. 29, 2021, entitled WINDOW CIRCUIT FOR AUDIO APPLICATIONS, the disclosure of each of which is hereby expressly incorporated by reference herein in its respective entirety.

BACKGROUND

Field

The present disclosure relates to audio amplifier circuits for wearable audio devices such as earbuds or headphones.

Description of the Related Art

A wearable audio device can be worn by a user to allow the user to enjoy listening of an audio content stream being played by a mobile device. Such an audio content stream may be provided from the mobile device to the wearable audio device through, for example, a short-range wireless link. Once received by the wearable audio device, the audio content stream can be processed by one or more circuits to generate an output that drives a speaker to generate sound waves representative of the audio content stream.

It is desirable to have the foregoing sound waves provide reproduction of the audio content stream with high-fidelity. It is also desirable for the wearable audio device to operate in a power-efficient manner, since such devices are commonly powered by batteries having limited capacities.

SUMMARY

In some implementations, the present disclosure relates to a calibration circuit for an audio amplification system. The calibration circuit includes a tone generator configured to provide a tone having a frequency to an input path of an audio amplifier, such that an input signal provided to the audio amplifier includes the tone, a first sampling circuit configured to sample an output signal at an output node of the audio amplifier, and a second sampling circuit configured to sample the input signal at an input node of the audio amplifier. The calibration system further includes a gain adjustment circuit configured to generate a correction signal based on the sampled output signal and the sampled input signal to correct for a gain variation of the audio amplifier.

In some embodiments, the calibration circuit can be a part of an audio amplification system having a digital audio path configured to provide a digital signal, and the audio amplifier configured to receive the digital signal as the input signal and generate the output signal.

In some embodiments, the calibration circuit can be implemented on a semiconductor die. In some embodiments, the semiconductor die can further include the audio amplification system.

In some embodiments, the calibration circuit can be implemented on a packaged module. In some embodiments, the packaged module can further include the audio amplification system.

In some embodiments, the calibration circuit can be implemented in a wireless device also includes an antenna for receiving a wireless signal, a digital audio path configured to provide a digital signal representative of the wireless signal, and an audio amplifier configured to receive the digital signal as the input signal and generate the output signal.

In some embodiments, the wireless device can further include a speaker in communication with the audio amplifier and configured to generate sound waves based on the output signal.

In some embodiments, the wireless device can be a wireless headphone or a wireless earphone.

For purposes of summarizing the disclosure, certain aspects, advantages and novel features of the inventions have been described herein. It is to be understood that not necessarily all such advantages may be achieved in accordance with any particular embodiment of the invention. Thus, the invention may be embodied or carried out in a manner that achieves or optimizes one advantage or group of advantages as taught herein without necessarily achieving other advantages as may be taught or suggested herein.

DETAILED DESCRIPTION OF SOME EMBODIMENTS

The headings provided herein, if any, are for convenience only and do not necessarily affect the scope or meaning of the claimed invention.

Figure 1:
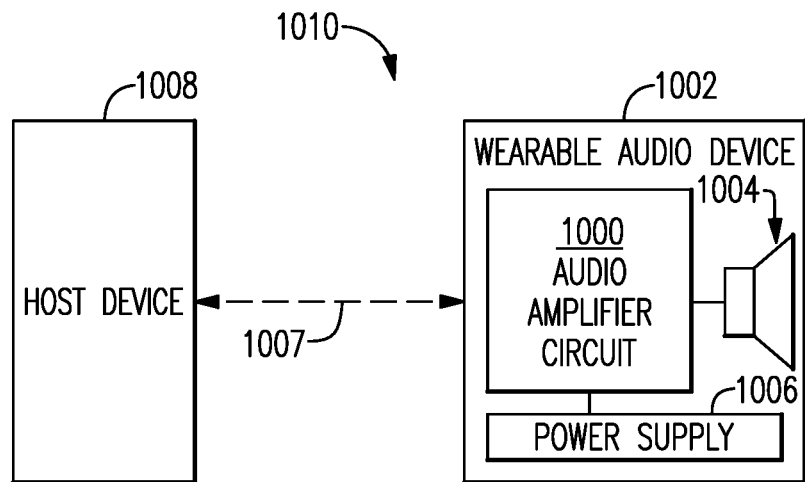
FIG. 1 depicts a system that includes a wearable audio device in communication with a host device, where the wearable audio device includes an audio amplifier circuit.

FIG. 1 depicts a system 1010 that includes a wearable audio device 1002 in communication with a host device 1008. Such communication, depicted as 1007 in FIG. 1, can be supported by, for example, a wireless link such as a short-range wireless link in accordance with a common industry standard, a standard specific for the system 1010, or some combination thereof. In some embodiments, the wireless link 1007 includes digital format of information being transferred from one device to the other (e.g., from the host device 1008 to the wearable audio device 1002).

In FIG. 1, the wearable device 1002 is shown to include an audio amplifier circuit 1000 that provides an electrical audio signal to a speaker 1004 based on a digital signal received from the host device 1008. Such an electrical audio signal can drive the speaker 1004 and generate sound representative of a content provided in the digital signal, for a user wearing the wearable device 1002.

In FIG. 1, the wearable device 1002 is a wireless device; and thus typically includes its own power supply 1006 including a battery. Such a power supply can be configured to provide electrical power for the audio device 1002, including power for operation of the audio amplifier circuit 1000. It is noted that since many wearable audio devices have small sizes for user-convenience, such small sizes places constraints on power capacity provided by batteries within the wearable audio devices.

In some embodiments, the host device 1008 can be a portable wireless device such as, for example, a smartphone, a tablet, an audio player, etc. It will be understood that such a portable wireless device may or may not include phone functionality such as cellular functionality. In such an example context of a portable wireless device being a host device, FIGS. 2 and 3 show more specific examples of wearable audio devices 1002 of FIG. 1.

Figure 2:
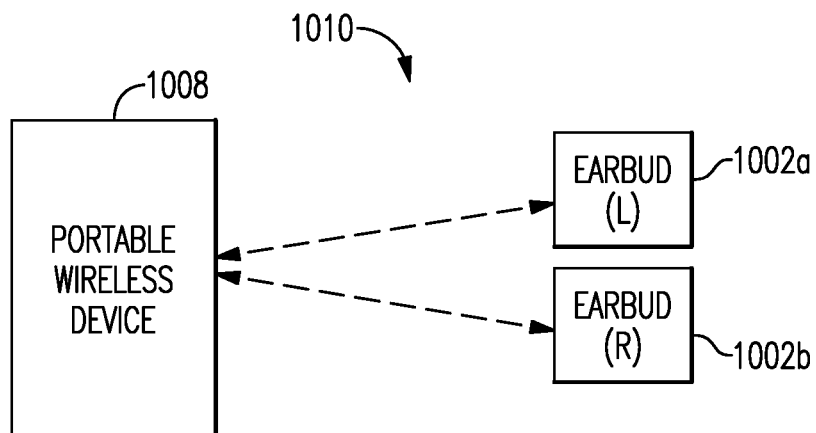
FIG. 2 shows that the wearable audio device of FIG. 1 can be implemented as a device configured to be worn at least partially in an ear canal of a user.

For example, FIG. 2 shows that the wearable audio device 1002 of FIG. 1 can be implemented as a device (1002a or 1002b) configured to be worn at least partially in an ear canal of a user. Such a device, commonly referred to as an earbud, is typically desirable for the user due to compact size and light weight.

In the example of FIG. 2, a pair of earbuds (1002a and 1002b) can be provided—one for each of the two ears of the user—and each earbud can include its own components (e.g., audio amplifier circuit, speaker and power supply) described above in reference to FIG. 1. In some embodiments, such a pair of earbuds can be operated to provide, for example, stereo functionality for left (L) and right (R) ears.

Figure 3:
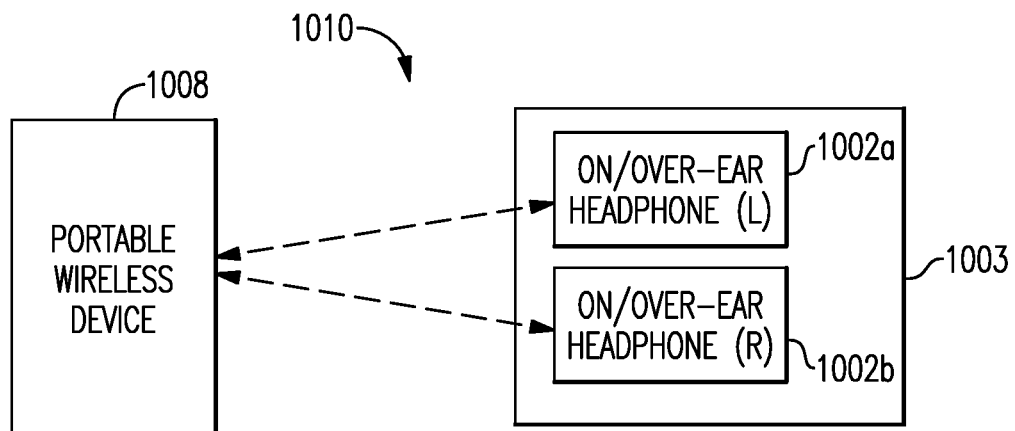
FIG. 3 shows that the wearable audio device of FIG. 1 can be implemented as part of a headphone configured to be worn on the head of a user, such that the audio device is positioned on or over a corresponding ear of the user.

In another example, FIG. 3 shows that the wearable audio device 1002 of FIG. 1 can be implemented as part of a headphone 1003 configured to be worn on the head of a user, such that the audio device (1002a or 1002b) is positioned on or over a corresponding ear of the user. Such a headphone is typically desirable for the user due to audio performance.

In the example of FIG. 3, a pair of audio devices (1002a and 1002b) can be provided—one for each of the two ears of the user. In some embodiments, each audio device (1002a or 1002b) can include its own components (e.g., audio amplifier circuit, speaker and power supply) described above in reference to FIG. 1. In some embodiments, one audio device (1002a or 1002b) can include an audio amplifier circuit that provides outputs for the speakers of both audio devices. In some embodiments, the pair of audio devices 1002a, 1002b of the headphone 1003 can be operated to provide, for example, stereo functionality for left (L) and right (R) ears.

Figure 4:
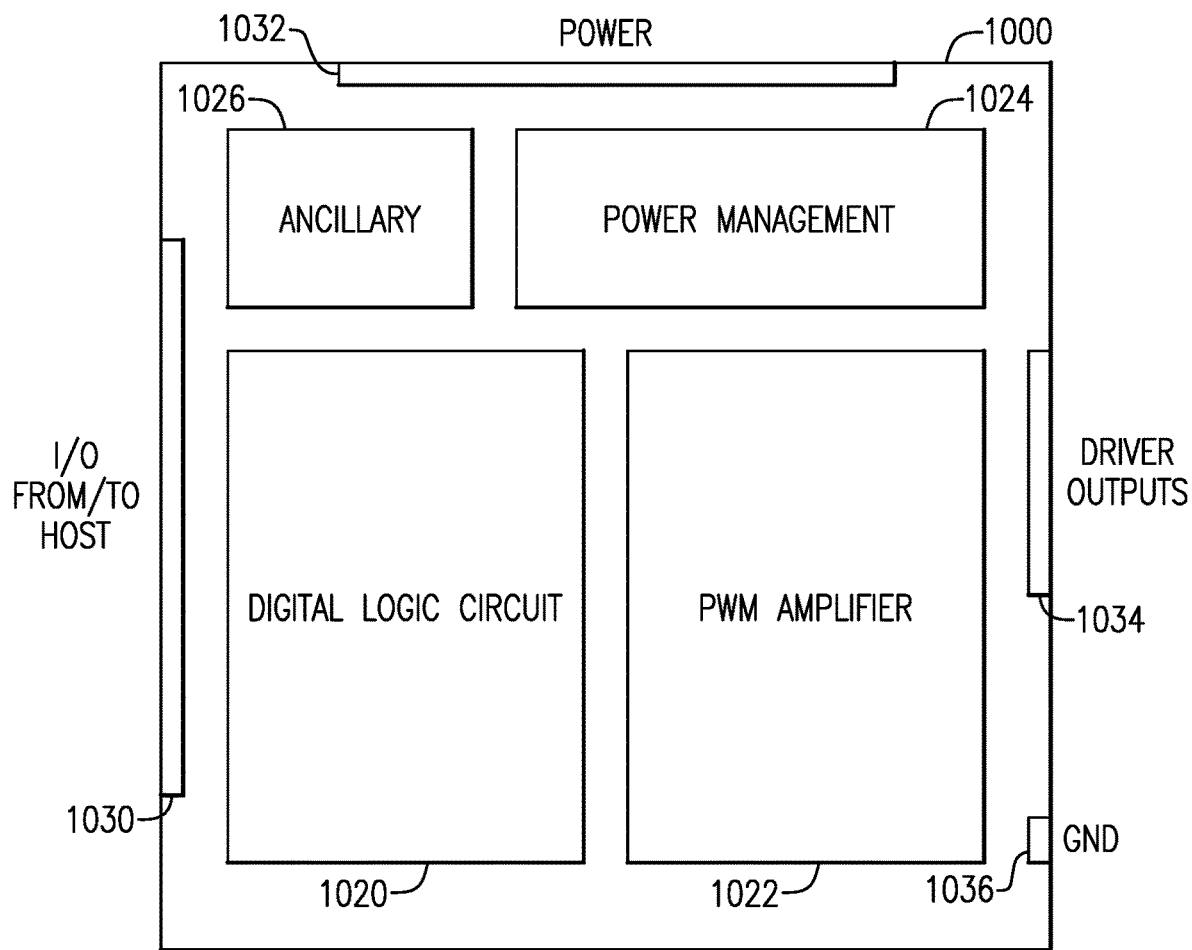
FIG. 4 shows that in some embodiments, the audio amplifier circuit of FIG. 1 can include a number of functional blocks.

FIG. 4 shows that in some embodiments, the audio amplifier circuit 1000 of FIG. 1 can include a number of functional blocks. More particularly, in FIG. 4, an audio amplifier circuit 1000 is shown to include a digital logic circuit block 1020, an amplifier block 1022, a power management block 1024, and an ancillary block 1026. Examples related to such blocks are described herein in greater detail.

In FIG. 4, the audio amplifier circuit 1000 is shown to further include various interfaces to allow the audio amplifier circuit 1000 to interact with other devices external to the audio amplifier circuit 1000. More particularly, an interface indicated as 1030 can be configured to support input/output (I/O) functionality with respect to a host device (e.g., 1008 in FIG. 1). An interface indicated as 1034 can be configured to support providing of electrical audio signals to a speaker (e.g., 1004 in FIG. 1). An interface indicated as 1032 can be configured to support providing of electrical power to various parts of the audio amplifier circuit 1000. One or more ground pins collectively indicated as 1036 (GND) can be configured to provide a grounding connection for the audio amplifier circuit 1000 relative to, for example, the audio device 1002 of FIG. 1.

Figure 5:
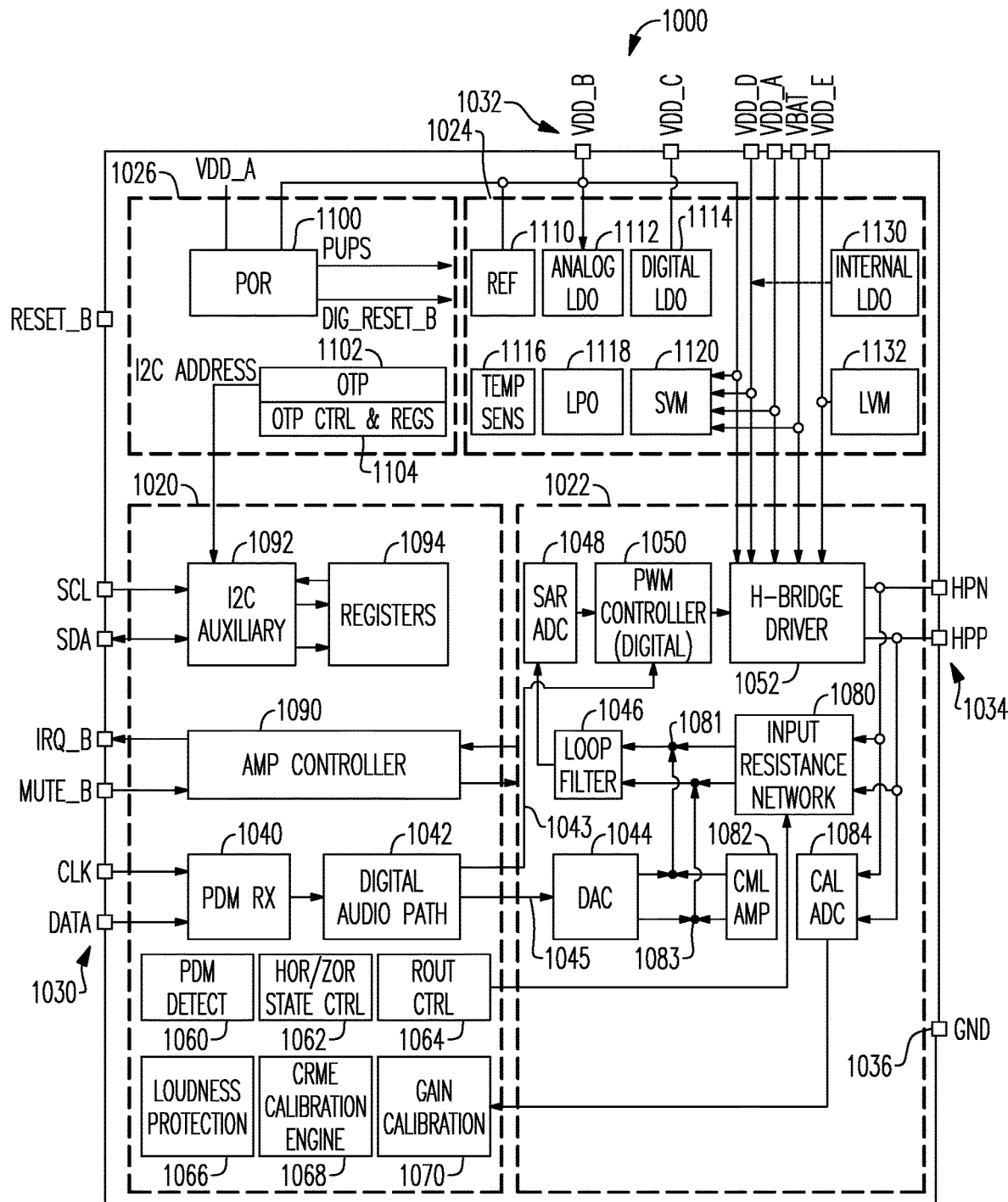
FIG. 5 shows a block diagram of an audio amplifier circuit that is a more specific example of the audio amplifier circuit of FIG. 4.

FIG. 5 shows a block diagram of an audio amplifier circuit 1000 that is a more specific example of the audio amplifier circuit 1000 of FIG. 4. In FIG. 5, a digital logic circuit block, generally indicated as 1020, can include a number of more specific functional blocks; an amplifier block, generally indicated as 1022, can include a number of more specific functional blocks; a power management block, generally indicated as 1024, can include a number of more specific functional blocks; and an ancillary block, generally indicated as 1026, can include a number of more specific functional blocks. Similarly, an interface indicated as 1030 can include a number of pins to support input/output (I/O) functionality with respect to a host device; an interface indicated as 1034 can include a number of pins to support providing of electrical audio signals to a speaker; an interface indicated as 1032 can include a number of pins to support providing of electrical power to various parts of the audio amplifier circuit 1000; and one or more ground pins collectively indicated as 1036 (GND) can be implemented to provide a grounding connection for the audio amplifier circuit 1000.

Referring to the example of FIG. 5, the digital logic circuit block 1020 can include a receiver (Rx) block 1040 configured to receive, for example, a pulse-density modulation (PDM) signal through a DATA pin of the interface 1030. The PDM Rx block 1040 is shown to also receive a clock signal through a CLK pin of the interface 1030. The PDM Rx block 1040 is shown to provide an output based on the input PDM signal.

It will be understood that while various examples are described herein in the context of pulse-density modulation of signals, one or more features of the present disclosure can also be implemented utilizing other types of modulations including other types of pulse modulations.

In FIG. 5, the digital logic circuit block 1020 can further include a digital audio path block 1042. Such a block is shown to receive the output of the PDM Rx block 1040 and route the received signal to the amplifier block 1022. Additional examples related to the digital audio path block 1042 are described herein in greater detail.

As shown in FIG. 5, the digital logic circuit block 1020 can also include various blocks for providing control and calibration functionalities. For example, amplifier controller 1090, resistance network control block 1064, amplifier operating mode (e.g., HOR/ZOR mode) control block 1062, inter-integrated circuit (I2C) auxiliary block 1092, registers block 1094, PDM detect block 1060 and loudness protection block 1066 can provide and/or support various control functionalities described herein. In another example, current ratio measurement calibration block 1068 and gain calibration block 1070 can provide calibration functionalities described herein. More particularly, the current ratio measurement calibration block 1068 can support generation of a reference signal for a loop circuit as described herein, and the gain calibration block 1070 can provide various functionalities for gain calibration as described herein.

Referring to the example of FIG. 5, the amplifier block 1022 is shown to include a pulse-width modulation (PWM) controller 1050 configured to receive a feedforward digital signal from the digital audio path block 1042 of the digital logic circuit block 1020 (through a path indicated as 1043) and generate control signals for an H-bridge driver 1052. The H-bridge driver 1052 provides analog electrical audio signals HPN, HPP as outputs. Such electrical audio signals can be provided to a speaker through respective pins of the interface 1034.

In the example of FIG. 5, the amplifier block 1022 is configured as a digital PWM Class D amplifier. In addition to the H-bridge driver 1052 being pulse-width modulated by the PWM controller 1050 based on the feedforward digital signal from the digital audio path block 1042, a closed-loop architecture is provided. Such a closed loop is shown to include an input resistance network 1080 coupled to the HPN and HPP outputs of the H-bridge driver 1052, with the input resistance network 1080 being coupled to a loop filter 1046 through summing nodes 1081, 1083. An analog output from the loop filter 1046 is shown to be converted into a digital signal by an analog-to-digital converter (ADC) 1048 such as a successive approximation register (SAR) ADC. The digital signal from the SAR ADC 1048 is provided to the PWM controller 1050.

In the example of FIG. 5, the amplifier block 1022 is configured to provide a reference analog signal for the foregoing closed-loop circuit. More particularly, a digital signal from the digital audio path block 1042 is shown to be provided to a digital-to-analog converter (DAC) 1044 (through a path indicated as 1045), and the resulting analog signal is provided to the summing nodes 1081, 1083. The summing nodes 1081, 1083 are also shown to be provided with respective signals from a common-mode-limit (CML) amplifier 1082.

In the example of FIG. 5, the audio amplifier circuit 1000 is shown to include a gain calibration feature. Such a feature is shown to include a calibration ADC 1084 coupled to the HPN and HPP outputs of the H-bridge driver 1052 to provide a digital signal representative of the analog output signals of the H-bridge driver 1052. The digital signal from the calibration ADC 1084 is shown to be provided to the gain calibration block 1070 of the digital logic circuit block 1020.

In the example of FIG. 5, the H-bridge driver 1052 shown to be provided with multiple levels of supply voltages (e.g., VBAT, VDD_A, VDD_B, VDD_D, VDD_E). Such multiple voltage levels can allow the H-bridge driver 1052 to operate with improved power efficiency.

Additional examples concerning the amplifier block 1022 are described herein in greater detail.

In FIG. 5, the power management block 1024 can include a number of functional blocks configured to provide and/or support providing of power to various parts of the audio amplifier circuit 1000. For example, the power management block 1024 can be configured to provide routing of multiple supply voltage levels (e.g., VBAT, VDD_A, VDD_B, VDD_D, VDD_E) to the H-bridge driver 1052 of the amplifier block 1022. For the example supply voltage levels, VBAT>VDD_A>VDD_B>VDD_D>VDD_E.

Such supply voltages can be provided from source(s) external to the audio amplifier circuit 1000, from internal source(s), or some combination thereof. In the example of FIG. 5, supply voltages VBAT, VDD_A and VDD_B are provided from external source(s); VDD_D may be provided from an external source or from an internal source implemented as a low drop out (LDO) regulator 1130; and VDD_E is provided from an internal source implemented as a low voltage monitor (LVM) supply 1132.

Some or all of the foregoing voltages can be monitored by one or more voltage monitors. For example, a supply voltage monitor (SVM) 1120 is shown to monitor the voltages VBAT, VDD_A, VDD_B and VDD_D. Such an SVM can include low power low resolution ADCs that monitor the supply voltages and produce respective digital outputs representative of the supply voltages; and such monitored digital outputs can be utilized by other digital circuitry to control various functionalities of the audio amplifier circuit 1000. In another example, the voltage VDD_E is shown to be self-monitored by the LVM supply 1132.

Referring to the example of FIG. 5, the power management block 1024 is shown to further include a reference (Ref) block 1110. Such a reference block can be implemented as a low voltage, low power bandgap reference circuit configured to operate with a supply voltage (e.g., VDD_B) to produce a low reference voltage as an output. Such a reference voltage can be utilized for operation of an analog LDO regulator 1112 and a digital LDO regulator 1114, as well as other functional blocks of the audio amplifier circuit 1000. The analog LDO regulator 1112 can be implemented as a lower power linear regulator configured to provide a desired voltage for a number of circuits of the audio amplifier circuit 1000. The digital LDO regulator 1114 can be implemented as a low power linear regulator configured to provide a desired voltage for various digital logic and digital core circuits of the audio amplifier circuit 1000.

Referring to the example of FIG. 5, the power management block 1024 is shown to further include a low power oscillator (LPO) 1118. Such an LPO can be configured to support operation of the audio amplifier circuit 1000. The power management block 1024 is shown to further include a sensor block 1116 such as a temperature sensor. Such a sensor can be configured to detect operating condition(s) (e.g., temperature) of some or all of the audio amplifier circuit 1000; and such sensed condition(s) can be utilized to support one or more functionalities (e.g., fault protection) for the audio amplifier circuit 1000.

In FIG. 5, the ancillary block 1026 is shown to include a power-on-reset (POR) block 1100. Such a POR block can be implemented to provide a number of functionalities. For example, power-on reset functionality can be provided by the POR block 1100, where the POR block 1100 monitors the RESET_B pin and supply voltage conditions to control and/or support power-on sequencing of various regulators, clock system and wall level shifters utilizing respective control signals (Pups). Once such power-on sequencing is achieved and the controlled components are operating in a stable manner, a release signal (Dig_reset_B) is provided to allow operation of various digital blocks.

The POR block 1100 can also control and/or support a power-down sequence. Such a power-down sequence can be achieved in response to a control signal from a host device (e.g., setting RESET_B to a initiate power-down), or based on detection of one or more conditions. Such conditions can include, for example, a brownout detection and various fault detections.

In FIG. 5, the ancillary block 1026 is shown to include a one-time programmable memory (OTP) 1102 and a block 1104 providing control and register functionalities for the OTP block 1102. Such functionalities can include issuing of a control signal (I2C address) to the 120 block 1092 to load appropriate registers of the Registers block 1094 during a boot process.

Figure 6:
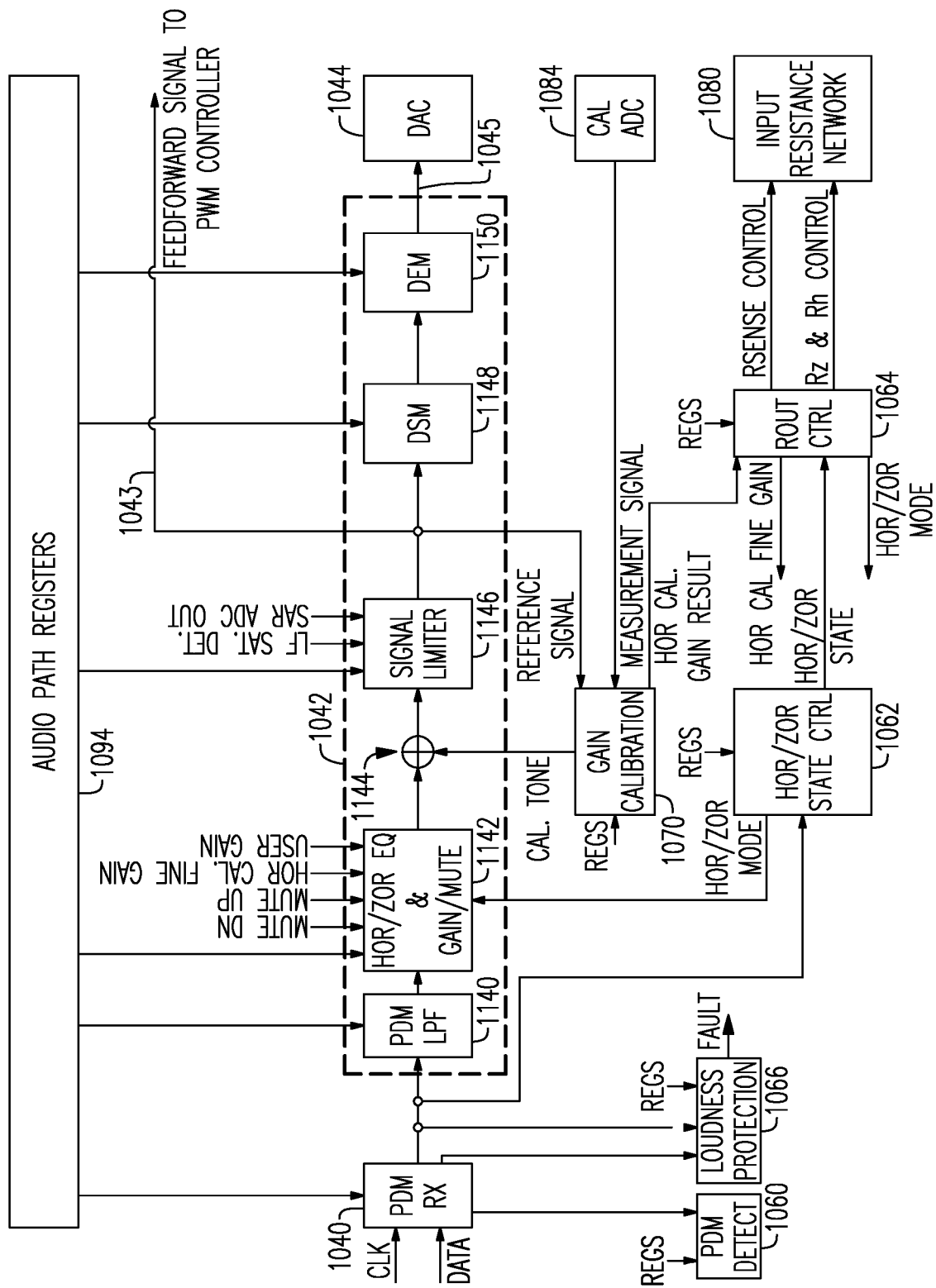
FIG. 6 shows a block diagram that includes a digital audio path block that is a more specific example of the digital audio path block of FIG. 5.

FIG. 6 shows a block diagram that includes a digital audio path block 1042 that is a more specific example of the digital audio path block 1042 of FIG. 5. In FIG. 6, a pulse-density modulation (PDM) receiver (Rx) block 1040 is shown to receive a PDM signal DATA and a clock signal CLK, and provide a PDM digital signal to the digital audio path block 1042.

More particularly, the PDM digital signal from the PDM Rx block 1040 is shown to be provided to a digital low-pass filter (PDM LPF) 1140. Such a filter block can be configured to, for example, attenuate out-of-band noise in the received PDM digital signal (e.g., noise resulting from a transmit (Tx) modulation in a host device). The PDM LPF block 1140 of FIG. 6 can also be configured to convert the PDM input signal into an output digital signal having pulse-code modulation (PCM).

In FIG. 6, the filtered PCM signal from the PDM LPF block 1140 is shown to be provided to an equalizer (EQ) block 1142. Such an EQ block can be configured to support gain and mute functionalities, as well as high-output resistance (HOR) and/or zero-output resistance (ZOR) operating modes. The EQ block 1142 provides an output PCM signal to a calibration tone mixer 1144. Additional details concerning the EQ block 1142 are provided herein.

Referring to FIG. 6, the calibration tone mixer 1144 is shown to mix a calibration tone signal from a gain calibration block 1070 with the output PCM signal from the EQ block 1142. Such mixing functionality can be provided during a calibration process such as an HOR/ZOR gain calibration process. Additional details concerning the HOR/ZOR gain calibration process are provided herein.

In FIG. 6, the output of the calibration tone mixer 1144 is also shown to be processed through a number of blocks before being provided a digital-to-analog converter (DAC) 1044 (also 1044 in FIG. 5) through a path 1045 for a closed-loop circuit as described herein. More particularly, the output (PCM signal) of the calibration tone mixer 1144 is shown to be provided to a signal limiter block 1146. Such a signal limiter can be configured to maintain a threshold limit for a DAC modulator (e.g., delta sigma modulator (DSM)) 1148 and also improve handling of low supply voltage operating conditions (e.g., when a HOR mode load reactance causes supply voltage requirements of an H-bridge drive to increase beyond a pure resistive load condition).

Referring to FIG. 6, it is noted that for the foregoing low voltage operating conditions, a SAR ADC (e.g., 1048 in FIG. 5) in the closed-loop circuit can be driven into saturation if the power supply is insufficient to provide the required peak voltage for the H-bridge driver (1052 in FIG. 5) needed to develop an output voltage at the load. If such a SAR ADC is saturated, the corresponding loop filter (1046 in FIG. 5) is saturated and is slow to recover from such overload conditions, resulting in undesirable audio artifacts. Thus, it is desirable to have the SAR ADC and loop filter prevented from entering saturation. Such saturation-prevention can be accomplished by limiting the digital audio signal in digital path of the closed-loop circuit to prevent the closed-loop circuit from trying to generate an unachievable output voltage and thereby push the SAR ADC and loop filter into saturation.

Referring to FIG. 6, the signal limiter 1146 can be configured to prevent the SAR ADC and loop filter from being in saturation due to insufficient supply voltage while trying to produce an output voltage from the corresponding digital input signal. The signal limiter 1146 can limit (e.g., by clipping the digital audio signal to a clip level) based on either or both of loop filter saturation detection signal (LF Sar. Det.) and SAR ADC output level (SAR ADC out) to keep the SAR ADC and the loop filter from overloading. It is noted that the SAR ADC output level can be monitored to have the signal limiter to clip the digital audio signal when the SAR ADC output level is close to saturation.

In FIG. 6, the signal limiter block 1146 is shown to provide an output signal to a DAC modulator (e.g., delta sigma modulator (DSM)) 1148. As described above, such an output of the signal limiter block 1146 can be clipped to avoid the SAR ADC and loop filter from being in saturation. The output of the signal limiter block 1146 can also prevent the DAC DSM 1148 from overloading.

In the example of FIG. 6, the DAC DSM block 1148 can be configured to re-modulate a higher-bit input signal (e.g., 24-bit signal), through delta-sigma modulation, into a lower-bit signal (e.g., 9-bit signal) that is appropriate for a dynamic element matching (DEM) block 1150. Accordingly, the example 9-bit DSM output signal drives the DEM block 1150 which can be implemented as a digital block configured to, for example, randomize a pattern of 512-bit cell drive to the DAC 1044 in a manner to linearize the DAC's response for use as a multi-bit delta-sigma DAC. Such a configuration can provide a desirable reference audio signal for the closed-loop circuit described herein.

In FIG. 6, a feedforward signal is shown to be provided to a PWM controller (1050 in FIG. 5) from an output of the signal limiter 1146 through a path 1043. As described herein, such a feedforward signal may or may not include a calibration tone signal mixed therein, depending on operating status of the gain calibration process.

In addition to the PDM LPF block 1140, EQ block 1142, mixer 1144, signal limiter block 1146, DSM block 1148 and DEM block 1150 that can be generally referred to as the digital audio path block 1042, FIG. 6 also shows a number of blocks that support various functionalities of the audio amplifier circuit (1000 in FIG. 5). For example, a PDM detection block 1060 (also 1060 in FIG. 5) is shown to be coupled to the PDM Rx block 1040. The PDM detection block 1060 can be configured to detect one or more states of PDM digital audio interface, including one or more fault conditions, to support operation and control of the audio amplifier circuit 1000.

In another example, a loudness protection block 1066 (also 1066 in FIG. 5) is shown to be coupled to the PDM Rx block 1040. The loudness protection block 1066 can be configured to monitor both of two output channels (main channel and auxiliary channel) of the PDM Rx block 1040. Upon loudness detection (e.g., digital audio signal exceeding a threshold), the loudness protection block 1066 can issue a fault signal to provide a muting or fault condition functionality.

In FIG. 6, the loudness protection block 1066 can include a pair of filter stages for the two output channels of the PDM Rx block 1040. Each filter stage can include a cascaded low-pass filter and high-pass filter structure configured to approximate a frequency response such as an A-weighted frequency response. The filtered outputs can be provided to respective absolute value circuits, and outputs thereof can then be provided to comparator circuits and compared against a programmed threshold for each of the main channel, auxiliary channel and main-minus-auxiliary values. Logic outputs of the comparators can be sent to a multiplexer that can trigger a fault signal depending on a combination of the three comparator outputs.

In FIG. 6, a number of functional blocks are shown to be coupled to and/or be related to one or more functional blocks of the digital audio path block 1042. For example, a digital-to-analog converter (DAC) 1044 is shown to be coupled to an output of the DEM block 1150. Such a DAC can be utilized to provide a reference signal for a closed-loop architecture of the audio amplifier circuit (1000 in FIG. 5). Additional details concerning the closed-loop architecture are described herein.

In another example, a HOR/ZOR state control block 1062 is shown to be coupled to the EQ block 1142. Such a control block, along with a resistance control (Rout ctrl) block 1064 and a resistance network 1080, can be utilized to provide various functionalities associated with high-output resistance (HOR) and zero-output resistance (ZOR) operating modes. Additional details concerning such operating modes are described herein.

In yet another example, a gain calibration block 1070 is shown to provide a calibration tone to the mixer 1144 based on inputs from signal limiter 1146 and a calibration ADC 1084. Additional details concerning gain calibration of the audio amplifier circuit (1000 in FIG. 5) are described herein.

In FIG. 6, operations of various functional blocks are shown to be supported by audio path registers 1094. Such registers can be a part of or associated with the registers block 1094 of FIG. 5 and be configured in a similar manner.

Figure 7:
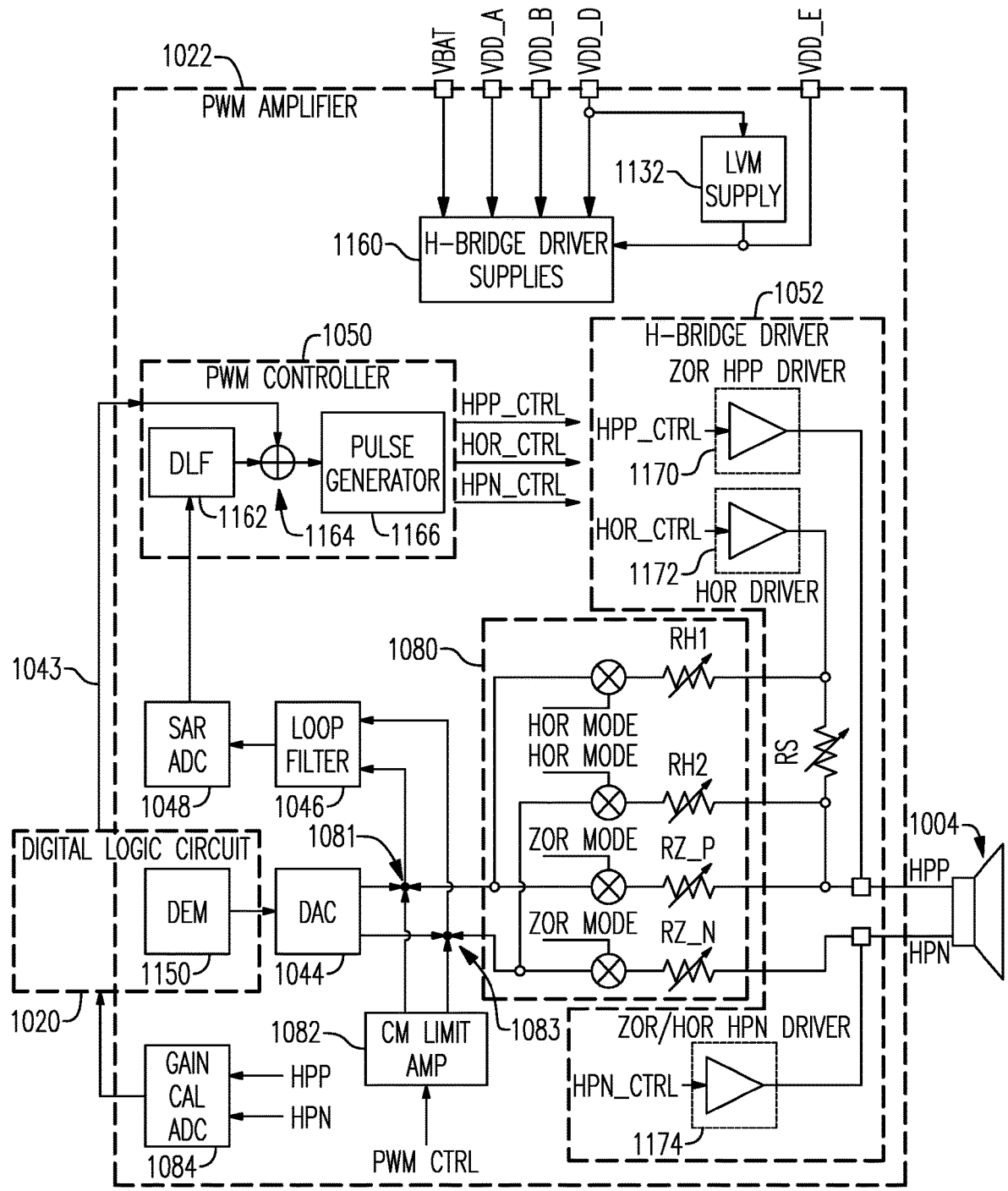
FIG. 7 shows a block diagram of an amplifier block that is a more specific example of the amplifier block of FIG. 5.

FIG. 7 shows a block diagram of an amplifier block 1022 that is a more specific example of the amplifier block 1022 of FIG. 5. The amplifier block 1022 of FIG. 7 includes a digital PWM synthesis class D amplifier architecture. It is noted that unlike a purely analog class D amplifier architecture where pulse-width modulation (PWM) is analog, the amplifier architecture of the amplifier block 1022 includes pulse width modulation of H-bridge drivers being developed via digital pulse-width modulation by a digital PWM controller 1050. The amplifier architecture of the amplifier block 1022 also includes a closed-loop control feature having a high loop gain error amplifier and an ADC digitizer.

As described in reference to FIG. 6, a feedforward digital signal is provided to the PWM controller 1050 from the digital audio path 1042 of the digital logic circuit 1020. More particularly, the feedforward digital signal is provided to the PWM controller 1050 from an output of the signal limiter block 1146, through a signal path 1043. In FIG. 7, such a signal path is also indicated as 1043.

As also described in reference to FIG. 6, the digital signal from the output of the signal limiter block 1146 is also provided to the DAC 1044 through the DSM block 1148 and the DEM block 1150. An analog signal from the output of the DAC 1044 is utilized as a reference audio signal for the above-referenced closed-loop of the amplifier block 1022 of FIG. 7.

Referring to FIG. 7, it is noted that the feedforward digital audio signal that is provided to the PWM controller 1050 (through the path 1043) is utilized to create most of a signal that determines pulse modulation for the H-bridge driver 1052. More particularly, the PWM controller 1050 is shown to include a pulse generator 1166 that generates control signals HPP_ctrl, HOR_ctrl, HPN_ctrl based mostly on the feedforward digital audio signal provided through the path 1043 and a mixer 1164. The control signal HPP_ctrl is provided to a ZOR HPP driver 1170 to generate an analog audio signal HPP when in a ZOR mode; the control signal HOR_ctrl is provided to an HOR driver 1172 to generate an analog audio signal HPP when in an HOR mode; and the control signal HPN_ctrl is provided to a ZOR/HOR HPN driver 1174 to generate an analog audio signal HPN when in either of the ZOR and HOR modes. The analog signals HPP and HPN are shown to drive a speaker 1004 to generate sound.

Referring to FIG. 7, it is also noted that an error signal generated by the closed-loop is utilized to develop the remainder of the signal that determines pulse modulation for the H-bridge driver 1052. Such an error signal is shown to be provided to the pulse generator 1166 from a successive approximation register (SAR) ADC 1048 through a digital loop filter (DLF) 1162 and the mixer 1164. Such an error signal resulting from the closed-loop provides improved audio performance of the amplifier circuit. Examples related to such a closed-loop are described herein in greater detail.

In the example of FIG. 7, the H-bridge driver 1052 is shown to include a ZOR HPP driver 1170, an HOR driver 1172 and a ZOR/HOR HPN driver 1174, and a resistance network 1080 (also 1080 in FIG. 6) is shown to include a sense resistance (Rs), HOR feedback resistances (Rh1, Rh2) and ZOR feedback resistances (Rz_p, Rz_n). With such drivers, a ZOR mode can be implemented so that the ZOR HPP (1170) and ZOR/HOR HPN (1174) drivers directly drive the speaker 1004 (with signals through HPP and HPN nodes), and the ZOR feedback resistances (Rz_p, Rz_n) of the resistance network 1080 directly sense the voltage across the speaker load (HPP and HPN). Accordingly, the ZOR HPP (1170) and ZOR/HOR HPN (1174) drivers are directly connected to the HPP and HPN nodes, and thus the speaker load, during the ZOR mode.

Referring to FIG. 7, an HOR mode can be implemented so that the HOR feedback resistances (Rh1, Rh2) sense a voltage across the sense resistance Rs (e.g., an on-chip current sense resistor), where Rs can be adjusted to be same or close to the resistance (RL) of the speaker load. With such a configuration, the closed-loop operation can force the voltage signal across the sense resistance Rs to be representative of the input signal provided to the H-bridge driver 1052. Accordingly, the resulting current through the speaker load causes an output voltage of the H-bridge driver 1052 to be equal to or representative of the input signal provided to the H-bridge driver 1052 times the speaker impedance.

It is noted that during the foregoing HOR mode operation, the ZOR HPP driver 1170 is turned off. It is also noted that the resistance Rs is in series with the HOR driver 1172 and the HPP node. Accordingly, the speaker load is driven through the high impedance of the HPP node. The ZOR/ HOR HPN driver 1174 drives the other side of the speaker load.

It is noted that the foregoing HOR mode can be utilized to address a low-level electromagnetic-coupled noise problem. For example, the high output resistance mode can attenuate the noise at the speaker load. More particularly, in the HOR mode, the speaker load is driven in a high-output-impedance mode as a current source mode output instead of a voltage source mode output. Accordingly, the H-bridge driver 1052 forces a high-fidelity audio current waveform into the speaker load, regardless of load impedance, non-linearities and/or noise injections.

The foregoing HOR mode can be calibrated an adjustment of the sense resistance Rs and a digital HOR calibration gain factor applied in one or more calibration blocks. In some embodiments, such gain calibration can be achieved periodically to equal the gain in the ZOR mode. Examples related to such gain calibration are described herein in greater detail.

In the example of FIG. 7, the PWM amplifier 1022 utilizes modulation frequency and supply voltage scheme to provide high performance and efficient operation of the H-bridge driver 1052. The modulation frequency can have a value of several MHz for a pulse width update rate to provide an update period. Such an update period is divided into N ticks utilizing a clock signal. An output pulse width can range from 1 to M times the tick width. Accordingly, the output pulse width can have a minimum value of 1× (tick width) and a maximum value of M× (tick width).

Referring to FIG. 7, the foregoing supply voltage scheme can include utilization of multiple supply voltages for the output pulses. For example, voltages VBAT>VDD_A>VDD_B>VDD_D>VDD_E can be provided to an H-bridge driver supply circuit 1160 for the output voltages. Such multiple voltages provided to the output pulses can provide improved efficiency during operations at different signal levels. For example, for lower level signals, lower voltages can be utilized; and for higher level signals, higher voltages can be utilized. To achieve such functionality, the H-bridge driver 1052 can include multiple driver transistors configured to allow dynamic switching of voltages to any of the multiple values based on encoded control signals from the PWM controller 1050.

For example, and referring to FIG. 7, the ZOR HPP and ZOR/HOR HPN drivers (1170, 1174) are utilized for ZOR mode, and the HOR and ZOR/HOR HPN drivers (1172, 1174) are utilized for HOR mode. Depending on the mode of operation (ZOR or HOR), amplitude of input signal and PWM encoding rules, the PWM controller 1050 connects the respective drivers to one of the available supplies provided through the H-bridge driver supply circuit 1160 to create a zero, positive or negative differential drive across the output load nodes HPP and HPN.

As described above, the PWM amplifier 1022 utilizes modulation frequency such that a pulse width update is provided during a corresponding period. Thus, the PWM controller 1050 can select the supply voltages and pulse width for the respective drivers. For example, the PWM controller 1050 can select the largest pulse width and lowest supply possible during each update period. Such selections of pulse width and supply voltage level can result in the lowest or reduced PWM quantization error and best or improved power efficiency.

Configured in the foregoing manner, the output of the H-bridge driver 1052 can be taken from the differential voltage on the HPP and HPN nodes and directly drive the speaker 1004. It is noted that such an output differs from traditional class D amplifiers in that the foregoing output appears as high frequency, multi-voltage-level stepping/ switching activity. Such voltage stepping activity is a notable property of the architecture of the PWM amplifier 1022. For the ZOR mode of operation and for audio signals such as sine waves, the voltage level stepping can follow the envelope of the audio signal. In the HOR mode of operation, the HPP and HPN single-ended output switching appears different than in the ZOR mode. The behavior of the signal on the HPP and HPN nodes can depend on the polarity of the output signal. When measuring the HPP and HPN nodes single-ended to ground, during parts of the output signal cycle, the HPP and HPN waveforms may not resemble the audio envelope in the same way as in the ZOR mode. Such a difference can result from the HOR mode's selection of HPP node voltage that forces the PWM controller 1050 to produce switching behavior that holds the HPP node high. Therefore, the HPP node is held high for a significant part of the waveform cycle while the HPN node is switching.

In the PWM amplifier 1022 of FIG. 7, the closed-loop can be configured and operated as follows. As described herein, such a closed-loop can provide an error signal that is utilized for development of a signal that determines pulse modulation for the H-bridge driver 1052, thereby providing improved audio performance of the amplifier circuit.

Referring to FIG. 7, the outputs HPP and HPN of the H-bridge driver 1052 can be fed back to the summing nodes 1081, 1083 through the resistance network 1080. More particularly, the output node HPP is shown to be coupled to the summing node 1081 through a resistance Rz_p and a respective mixer also being provided with a ZOR mode signal as an input. Thus, the output of the mixer is shown to be added with a respective reference output of the DAC 1044 at the summing node 1081; and the summed signal is shown to be provided to the loop filter 1046. Similarly, the output node HPN is shown to be coupled to the summing node 1083 through a resistance Rz_n and a respective mixer also being provided with a ZOR mode signal as an input, such that the output of the mixer is shown to be added with a respective reference output of the DAC 1044 at the summing node 1083; and the summed signal is shown to be provided to the loop filter 1046.

Configured in the foregoing manner, the loop filter 1046 is provided with a signal representative of a differential error between the outputs (HPP, HPN) of the H-bridge driver 1052 and the reference signal provided by the DAC 1044. In the example of FIG. 7, the each of the summing nodes 1081, 1083 is shown to be provided with a signal from the common-mode limiting (CML) amplifier 1082. Such signals from the CML amplifier 1082 can be utilized to limit the input common-mode voltage of the loop filter 1046.

In the example of FIG. 7, the loop filter 1046 can include a 5th order high gain loop filter to provide an output to a low-power, high-speed SAR ADC 1048 to digitize the loop filter output. The digitized output of the SAR ADC 1048 is shown to be provided to the PWM controller 1050, where it is utilized by the PWM controller 1050 along with the feedforward signal (provided through the path 1043) to generate PWM control signals for the H-bridge driver 1052.

Referring to FIG. 7, it is noted that in the foregoing closed-loop, without any compensation, an inductance of the speaker's driver element can lead to significant differences in the open-loop frequency response at high frequencies (e.g., greater than 100 KHz) between the HOR and ZOR modes. Such an effect is due to the current-mode drive of the sense resistance working into the frequency dependent impedance of the speaker inductance during the HOR mode of operation.

In the closed-loop circuit of FIG. 7, the loop includes the loop filter 1046, SAR ADC 1048, PWM controller 1050, H-bridge driver 1052 and resistance network 1080. In addition to such components, a digital loop filter (DLF) 1162 can be provided to provide compensation for loop stability in situations where processing delays are present. In some embodiments, such a DLF can be configured to provide compensation by insertion of a programmable digital filter that includes parallel arrangement of finite impulse response (FIR) and infinite impulse response (IIR) sections, between the SAR ADC 1048 and the normal input location (mixer 1164 in FIG. 7). Such a DLF can be configured to provide a response that includes phase compensation in response to the effect of the inductor in the HOR mode, as well as shaping of one or more characteristics of the closed-loop.

As described herein, when the PWM amplifier 1022 of FIG. 7 is in ZOR mode, the gain is determined by the resistances of the resistance network 1080 working against the DAC (1044) output current. The feedback resistances (Rz_p, Rz_n) sense the voltage across the HPP and HPN nodes, and provides feedback to the loop filter inputs. The closed-loop with such a feedback can force the output of the PWM amplifier 1022 to be adjusted to equal or approximately equal the digital input with a net gain (e.g., G=1 such that a 0 dBFS input produces a 0 dBv output).

In HOR mode, however, the gain is determined differently, since the HOR mode utilizes a current-mode output where the signal current is produced across the sense resistance (Rs) and forced through the load resistance (Rload) of the speaker (1004 in FIG. 7). The HOR feedback resistances (Rh1, Rh2) sense the voltage across the sense resistance Rs, and such a sensed voltage works against the DAC output current. The closed-loop with such a feedback can force the output current gain of the PWM amplifier 1022 to be adjusted to be G=1/Rs. If there is no further adjustment, then the net end-to-end gain in the HOR mode would be G=Rload/Rs. If Rs and Rload are not equal to each other, then the HOR gain will not be equal to the gain in ZOR mode (G=1). To address such an effect, an audio amplifier circuit as described herein can configured to include an HOR gain calibration functionality utilizing, for example, adjustment of the sense resistance and a digital gain term to make the gain in HOR mode equal to or approximately equal to the gain in the ZOR mode. Examples related to such a gain calibration functionality are described herein in greater detail.

Figure 8:
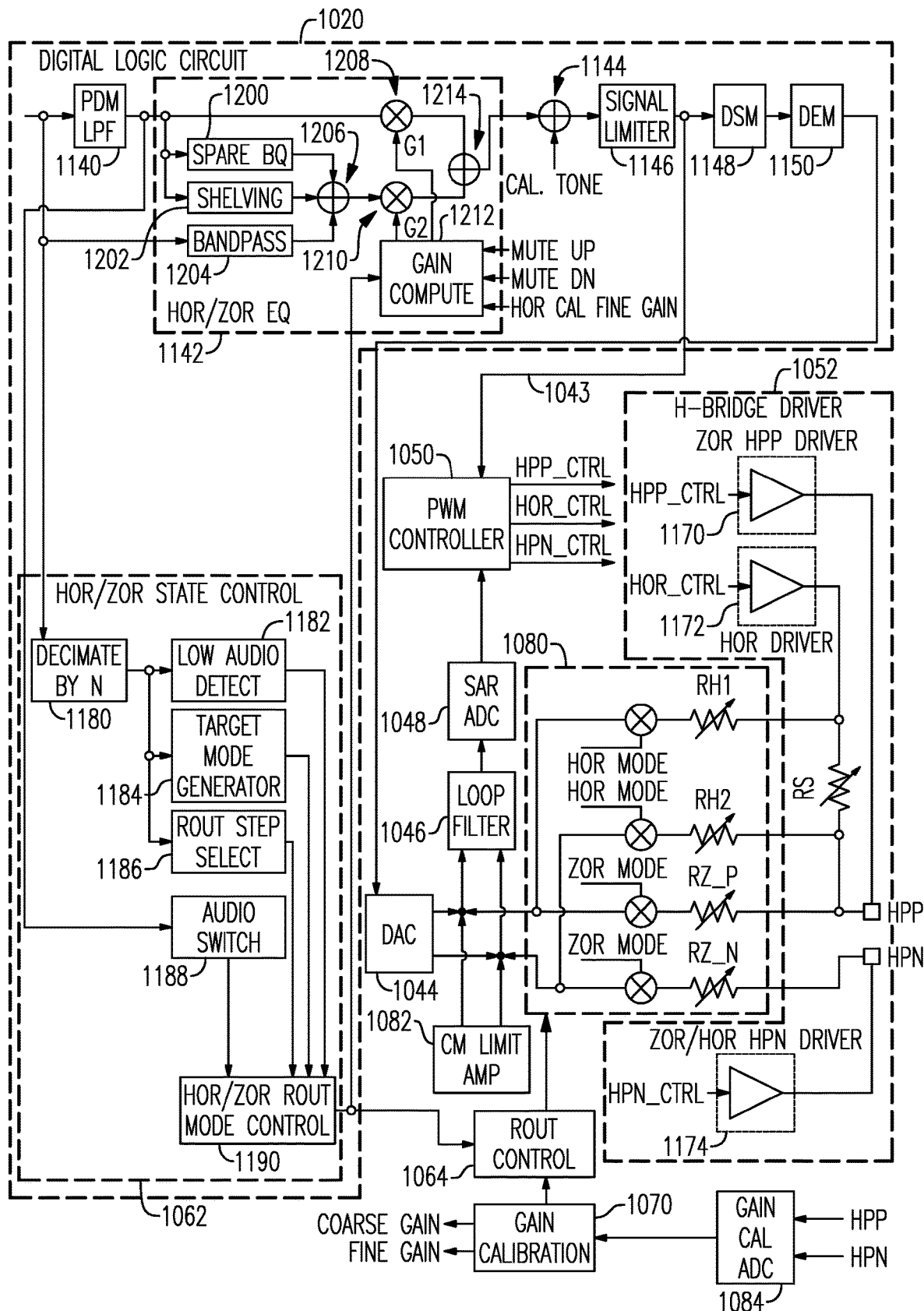
FIG. 8 shows a block diagram of a digital logic circuit block that is a more specific example of the digital logic circuit block of FIG. 5.

FIG. 8 shows a block diagram of a digital logic circuit block 1020 that is a more specific example of the digital logic circuit block 1022 of FIG. 5, implemented to operate with the H-bridge driver 1052 of FIG. 7 to provide functionalities including mode switching between HOR and ZOR modes. Such mode switching can be achieved as follows.

It is noted that the audio amplifier circuit as described herein can provide dynamic switching between HOR and ZOR modes. Such mode-switching operation can include switching of the feedback resistance configurations of the resistance network (1080 in FIG. 8) between the output nodes (HPP, HPN) to the loop filter block (1046). Such mode-switching operation can be achieved in a dynamic manner with low audio artifacts. However, when switching between modes, because of the complex impedance of the speaker driver element and the current-mode operation in the HOR mode, the end-to-end frequency response of the system may change. If such a difference in frequency response is not compensated, the change may result in audible artifacts. To compensate for the change in frequency response, the audio amplifier circuit as described herein can include a digital EQ filter to allow compensation of the frequency response difference between the two modes.

In addition, to minimize the audible artifacts during HOR/ZOR transitions, the audio amplifier circuit as described herein can include a number of features. For example, the resistance network 1080 can be controlled to provide stepped output resistance Rout. In another example, a HOR/ZOR EQ block 1142 can be configured to operate with the stepped Rout values. In yet another example, a HOR/ZOR state control block 1062 can be provided and configured to control the HOR/ZOR transitions.

It is noted that an abrupt transition in the output resistance Rout seen by the speaker driver during HOR/ZOR transitions can cause a sufficiently large phase shift to be audible. To reduce or eliminate such audible artifacts, an amplifier equivalent Rout can be made to transition more gradually by moving through a series of Rout steps (e.g., six Rout steps) during a transition between HOR and ZOR modes. A set of particular Rout step values can be selected by selected values of feedback resistances Rh and Rz of the resistance network 1080. Such Rout step values can be selected to produce approximately equal phase artifacts error per step. Further, time duration per step can be programmable over a modest range. Given a non-linear relationship between phase error and step size, Rout stepping as described herein can provide a significant impact on the reduction in the audibility of the artifacts.

As described in reference to FIG. 6, an HOR/ZOR EQ block 1142 can be provided as part of the digital audio path 1042. FIG. 8 shows that such an HOR/ZOR EQ block (also 1142) can be implemented to operate with the foregoing Rout stepping functionality.

Referring to FIG. 8, the HOR/ZOR EQ block 1142 is shown to be driven by the output of the PDM LPF block 1140. The HOR/ZOR EQ block 1142 can be configured to provide filtering to compensate for the difference between the HOR and ZOR mode frequency responses driving the speaker transducer. The HOR/ZOR EQ block 1142 is shown to include an EQ filter bank, gain compute block and cross-fading functionality.

More particularly, the EQ filter bank is shown to include three parallel filter sections 1200 (Spare BQ), 1202 (Shelving) and 1204 (Bandpass) configured to compensate the frequency response in the speaker transducer. The filter section 1200 (Spare BQ) can be implemented as a low frequency 2nd order (biquad) bandpass filter section (e.g., up to 1 KHz). The filter section 1202 (Shelving) can be implemented as a 4th order finite impulse response (FIR) shelving filter. The filter 1204 (Bandpass) can be implemented as a 2nd order general purpose biquad filter.

Figure 9:
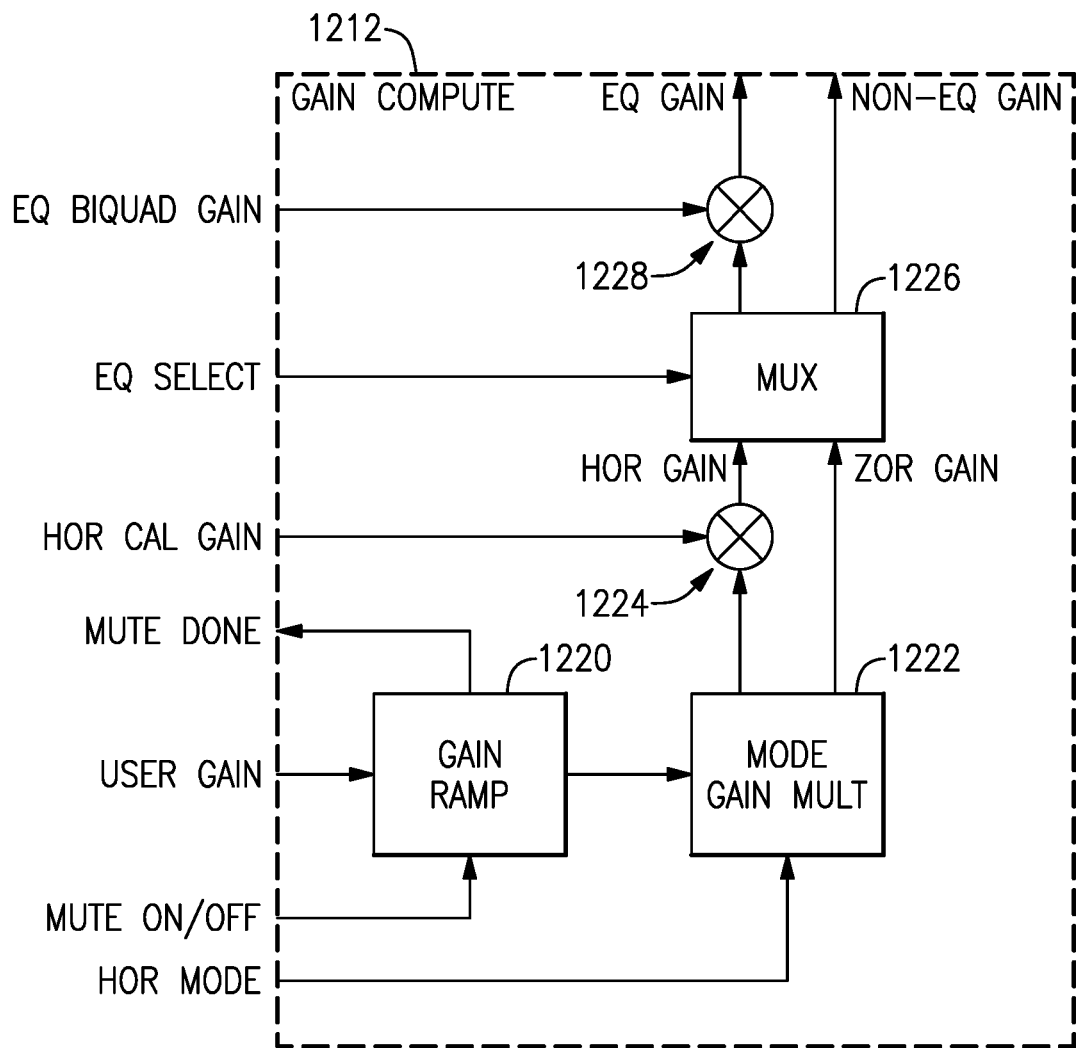
FIG. 9 shows a gain compute block that is a more specific example of the gain compute block of FIG. 8.

Referring to FIG. 8, the EQ block 1142 can be configured to optionally provide filtering to compensate for the difference between the HOR and ZOR mode frequency responses driving the speaker transducer. In addition to the foregoing EQ filter bank and the cross-fading functionality, the EQ block 1142 can also include a gain compute block 1212. FIG. 9 shows a more specific configuration of such a gain compute block.

Referring to FIGS. 8 and 9, the EQ block 1142 is shown to provide tapered in and out via a crossfading mixing structure of gains G1 and G2 (through mixers 1208, 1210) and an output adder 1214.

More particularly, gain G1 is shown to be associated with mixing of an unfiltered output of the PDM LPF block 1140 with a non-EQ gain signal from the gain compute block 1212 at the mixer 1208, and gain G2 is shown to be associated with mixing of a summed filtered signal with an EQ gain signal from the gain compute block 1212 at the mixer 1210. The foregoing summed filtered signal is shown to be obtained by outputs of the filter sections 1200, 1202, 1204 being added by an adder 1206. The input to each of the filter sections 1200 (Spare BQ) and the filter section 1202 (Shelving) is shown to be provided from the output of the PDM LPF block 1140, and the input to the filter section 1204 (Bandpass) is shown to be provided from the input of the PDM LPF block 1140.

Referring to FIGS. 8 and 9, the gain value G1 is associated with a non-filtered signal, and the gain value G2 is associated with a filtered signal. The gains G1 and G2 can be values ranging from 0 to 1, where G1+G2=1, and in the example context of Rout having six steps, each of G1 and G2 can have six discrete step values of 0, 0.2, 0.4, 0.6, 0.8 and 1. As described herein, such gain values can be stepped with the Rout stepping of the audio amplifier circuit.

Referring to FIG. 9, the gain compute block 1212 is shown to be configured to generate the non-EQ gain signal (to the mixer 1208 in FIG. 8) and the EQ gain signal (to the mixer 1210) based on a number of inputs. For example, the gain compute block 1212 can handle slowly changing gain parameters such as HOR/ZOR gain, user gain, HOR calibration gain, and EQ biquad gain. Based on some or all of such inputs, and depending on the operating mode (ZOR or HOR), the gain compute block 1212 can compute net EQ path gain and non-EQ path gain values and provide such gain values as outputs.

More particularly, the user gain is shown to be processed through a gain ramp 1220 and provided to a mode gain multiplexer 1222 that also receives a HOR mode signal. The mode gain multiplexer 1222 is shown to generate ZOR gain and HOR gain and provide such outputs to a multiplexer 1226, with the latter being mixed with a HOR calibration gain value by a mixer 1224. The multiplexer 1226 is shown to provide the non-EQ gain and EQ gain values based on the ZOR gain and HOR gain values, along with an EQ select input. The EQ gain value is shown to result from mixing of the respective output of the multiplexer 1226 with the EQ biquad gain by a mixer 1228.

Configured in the foregoing manner, the gain compute block 1212 can provide some or all of the following functionalities: provide a gain stage for digital audio gain adjustment, provide an amplifier state initiated gain ramp-up after start of audio, provide an amplifier initiated gain ramp-down before shutdown of audio, provide a gain stage for HOR/ZOR fine gain calibration (e.g., HOR calibration gain) where the fine gain calibration can be applied in all HOR modes (full and partial), provide gain control for a programmable ramp time, and provide a test mode programmable volume gain register to mute gain block with a variable attenuation step size to provide a desired dynamic range.

Configured as described above in reference to FIGS. 8 and 9, the HOR/ZOR EQ block 1142 can provide some or all of the following functionalities: enabling or bypassing of EQ functionality, compensating for transducer impedance vs frequency with a multi-section filter, switching in and out of the audio path with minimal or reduced audio artifacts, tracking of output resistance Rout, programmable filter coefficients, minimized or reduced latency, and provide EQ filtering active for HOR or ZOR mode and off for the other.

FIG. 8 also shows an HOR/ZOR state control block 1062 that can be a more specific example of the HOR/ZOR state control block 1062 of FIGS. 5 and 6. In the example of FIG. 8, the HOR/ZOR state control block 1062 can determine when to switch between HOR and ZOR modes by observing the audio signal path. Such a switching can be controlled so that audible artifacts due to switching are minimized or reduced. In some embodiments, HOR/ZOR switching can be configured to maximize or increase time in the ZOR mode for efficiency, but prioritize HOR mode when audio signal is low in order to minimize or reduce injected interference. The HOR/ZOR state control block 1062 can include an HOR/ZOR Rout mode control block 1190 that utilizes, for example, psychoacoustic principles, to mask or reduce transient artifacts during mode switching operations.

Referring to FIG. 8, the HOR/ZOR state control block 1062 can provide some or all of the following functionalities. First, the audio amplifier circuit can be placed in HOR mode when amplitude of the digital audio signal (e.g., obtained from the input side of the PDM LPF 1140) is low in order to minimize or reduce injected interference. Second, the audio amplifier circuit can be placed in ZOR mode when amplitude of the digital audio signal is high in order to improve efficiency. Third, transition time from ZOR to HOR mode can be made to be within a selected time duration. Fourth, Rout transitions can be made without or reduced audible artifacts. Fifth, HOR/ZOR target mode can be determined by an average audio level. Sixth, HOR/ZOR switching time can be set to be when the transition will be inaudible as determined by a combination of configurable factors such as crest factor, audio signal level being below a threshold value, and time from the last Rout change. Seventh, HOR/ZOR output impedance can have multiple (e.g., 6) steps corresponding to the Rout modes (e.g., Rour0, Rout1, Rout2, Rout3, Rout4, Rout5). Eighth, HOR/ZOR impedance steps can be controlled by moving from current impedance step toward the target impedance step when transitions are determined to be inaudible. Ninth, HOR/ZOR transitions can be programmable to step through discrete output impedances in order to minimize or reduce switching transients (e.g., output impedance step controls being implemented to correspond to output impedance steps of the audio amplifier). Tenth, HOR/ZOR transitions can be independently configured to occur with a minimum or reduced time between switching. Eleventh, HOR/ZOR mode can have a manual override configured by resister access, and such an override can be configured to allow setting of all mode and/or Rout settings.

In the example of FIG. 8, switching between HOR and ZOR modes can be achieved as follows. Switching between HOR and ZOR modes can include operations of the resistance network 1080, the HOR/ZOR EQ block 1142, and the HOR/ZOR state control block 1062.

Referring to FIG. 8 and the foregoing HOR/ZOR switching functionality, the resistance network 108 can be utilized to provide an Rout stepping functionality as described herein. It is noted that an abrupt transition in Rout seen by the speaker driver during HOR/ZOR transitions can cause a sufficiently large phase shift to be audible. To reduce such audible artifacts, an amplifier equivalent Rout can be made to transition more gradually be moving through a number of Rout steps (e.g., 6 steps) during a transition between HOR and ZOR modes. Such stepped Rout values can be achieved through selection of resistance values for Rh and Rz implemented as, for example, variable resistors. The equivalent Rout steps can be selected to produce approximately equal phase artifact error per step, and the time per step can be programmed over a selected range. Given the non-linear relationship between phase error and step size, Rout stepping functionality can provide a significant impact on the reduction in the audibility of the artifacts during HOR/ZOR transitions.

Referring to FIG. 8 and the foregoing HOR/ZOR switching functionality, the HOR/ZOR EQ block 1142 can be configured to provide EQ filtering functionality including EQ filtering functionality for compensation of the difference in frequency responses between HOR and ZOR modes as described herein. The HOR/ZOR EQ block 1142 can be configured to operate with such EQ filtering functionality during the HOR or ZOR mode. In some embodiments, some or all of the EQ block 1142 can be disabled in the HOR mode to save power, and be enable during the ZOR mode if desired or needed. It is noted that if the foregoing Rout stepping functionality is utilized, the EQ filter response can be synchronized to be gradually stepped with a corresponding change in the Rout.

Referring to FIG. 8 and the foregoing HOR/ZOR switching functionality, the HOR/ZOR state control block 1062 can be configured to decide when to switch between HOR and ZOR modes by monitoring the audio signal path. For example, audio signal path before and after the PDM LPF block 1140 can be monitored.

Referring to FIG. 8, the node on the input side of the PDM LPF block 1140 is shown to be coupled to a decimation circuit 1180 configured decimate the sampled signal by N (e.g., N=128). The decimated signal is then shown to be provided to a block 1182 for low audio detection, a block 1184 for generating a target mode, and a block 1186 for selecting an Rout step. Outputs of the blocks 1182, 1184, 1186 are shown to be provided to a HOR/ZOR Rout mode control block 1190. Referring to FIG. 8, the node on the output side of the PDM LPF block 1140 is shown to be coupled to an audio switch block 1188 that provides its output to the HOR/ZOR Rout mode control block 1190.

Configured in the foregoing manner, the HOR/ZOR state control block 1062 can determine when to switch between HOR and ZOR modes. Such determination can be based on some or all of a number of conditions. For example, an average of the sampled input signal can be obtained and compared to a threshold value. More particularly, a determination of whether the average of the sampled signal is greater than a HOR-to-ZOR threshold value can be made when in HOR mode, or whether the average of the sampled signal is less than a ZOR-to-HOR threshold value can be made when in ZOR mode. In another example, a determination of whether the input signal has a very low level can be made. In yet another example, the input signal can be passed through a high-pass filter, and a peak in such a filtered signal can be compared to a product of an average of the filtered signal and a crest factor. If the peak value is greater than the product, and if the input signal is at or near a zero crossing, a determination can be made to perform a mode-switching operation.

It is noted that the foregoing HOR-to-ZOR threshold value and ZOR-to-HOR threshold value may or may not be different.

For a HOR-to-ZOR transition, determination can be made as to whether the input signal level has crossed a respective threshold level, and whether a favorable transition condition (e.g., high crest factor, higher frequency masking event and a subsequent zero crossing). If so, the HOR-to-ZOR transition can be made to proceed. For a ZOR-to-HOR transition, determination can be made as to whether the input signal level has crossed a respective threshold level or has become sufficiently small, and whether a favorable transition condition (e.g., high crest factor, higher frequency masking event and a subsequent zero crossing). If so, the ZOR-to-HOR transition can be made to proceed. The foregoing transition techniques allow the audio amplifier to operate to deliver full output power in either HOR or ZOR modes, thus enabling the audio amplifier to remain in either mode until a favorable transition condition is present to thereby avoid audible artifacts.

As described herein, HOR mode gain is determined differently than ZOR mode gain. However, it is desirable to operate an audio amplifier circuit as described herein so that a net gain in the HOR mode is equivalent to a net gain in the ZOR mode. In some embodiments, HOR gain can be adjusted so to be equivalent to ZOR gain. In various examples described herein, such a ZOR gain can be considered to have a gain G=1; thus, HOR gain can be calibrated to also provide a gain G=1. Such a HOR gain calibration can be achieved as follows.

Figure 10:
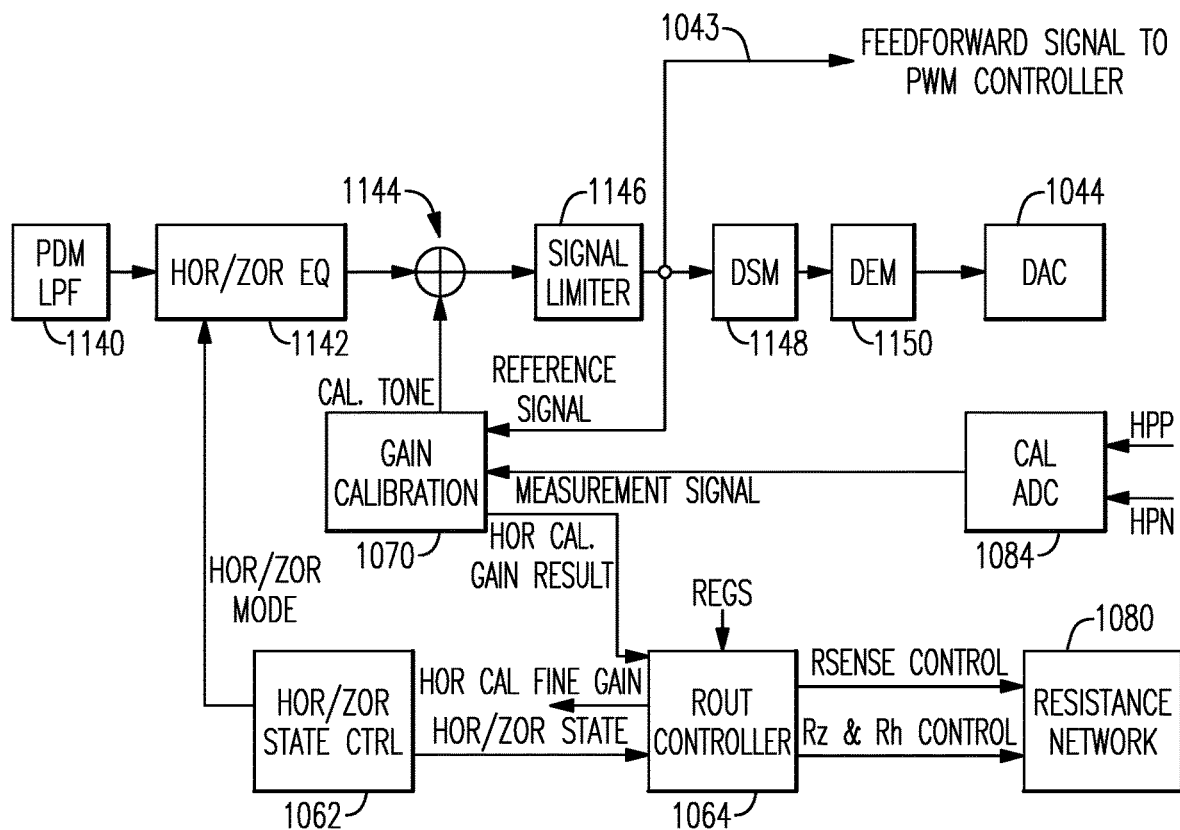
FIG. 10 shows various functional blocks of the audio amplifier circuit of FIG. 5 configured to provide a gain calibration sub-system.
Figure 11:
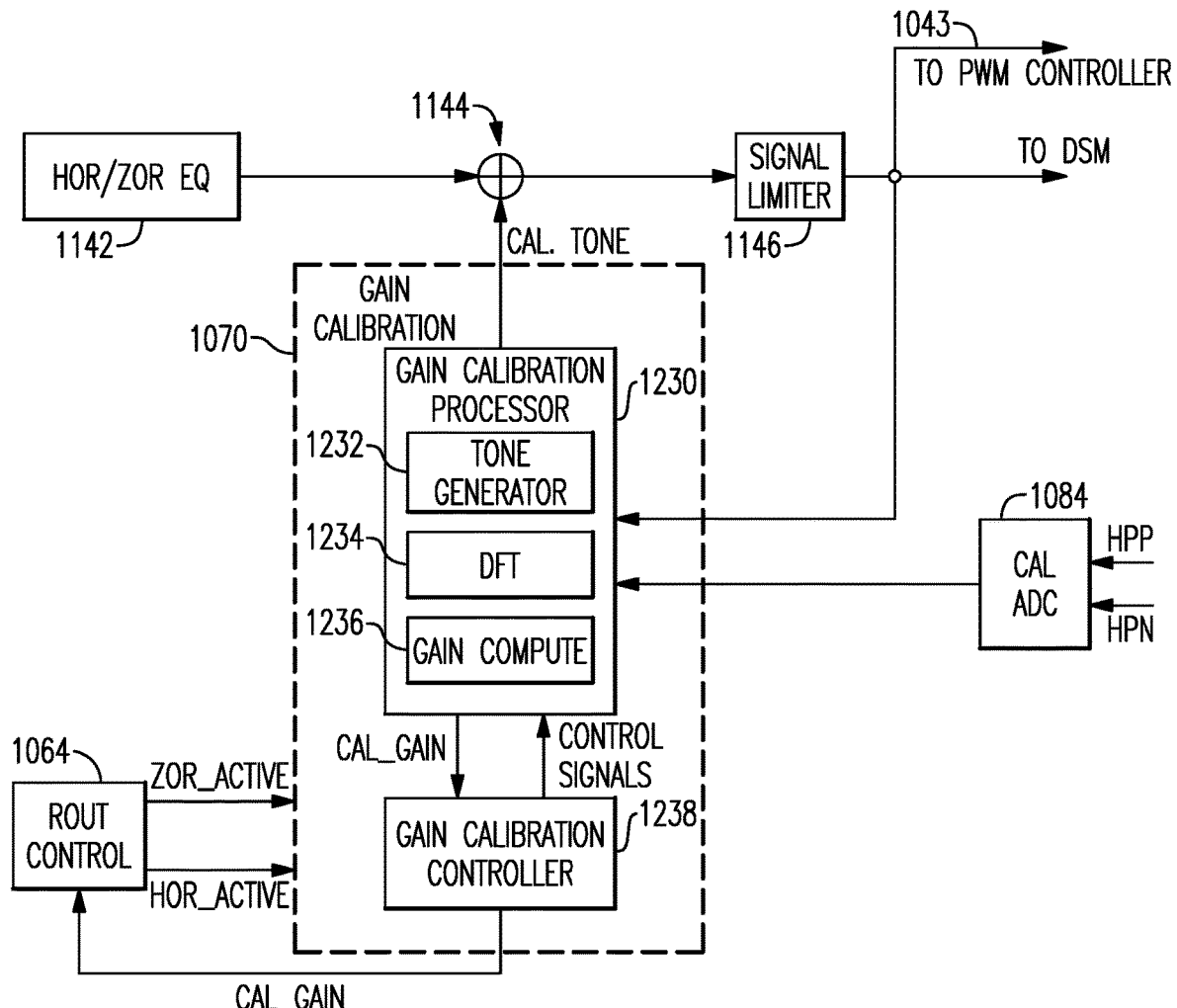
FIG. 11 shows a more detailed example of the gain calibration block of FIG. 10.

FIG. 10 shows various functional blocks of the audio amplifier circuit 1000 of FIG. 5, where such blocks can form an HOR gain calibration sub-system. More particularly, such a sub-system can include a gain calibration block 1070, a gain calibration ADC 1084, an Rout controller 1064, a resistance network 1080, and an HOR/ZOR EQ block 1142. FIG. 11 shows a more detailed example of the gain calibration block 1070 of FIG. 10.

Referring to FIGS. 10 and 11, the gain calibration block 1070 can be implemented as a digital block that includes a gain calibration processor 1230 and a gain calibration controller 1238. The gain calibration processor 1230 can be configured to perform gain estimation computation for HOR mode, and based on such gain estimation, desired sense resistance (Rs in FIGS. 7 and 8) value and digital gain correction value can be determined. The gain calibration controller 1238 can handle overall management of the gain calibration sub-system, including determining when to calibrate and/or determining conditions for a valid calibration.

Referring to FIGS. 10 and 11, the gain calibration ADC 1084 can be implemented as an analog block that digitizes the differential amplifier output HPP-HPN during a calibration cycle to use by the foregoing gain calibration processor 1230. The gain calibration ADC 1084 can be configured (e.g., with delta-sigma modulation) to handle large audio signals at the output (HPP, HPN) and have a sufficiently large dynamic range to detect the relatively lower amplitude calibration tone signal.

Referring to FIG. 11, the gain calibration processor 1230 is shown to include a calibration tone generator 1232 configured to generate an ultrasonic calibration tone (Cal. tone) which is mixed into the digital audio stream with the mixer 1144 before the signal limiter block 1146. The tone generator 1232 can also be configured to provide programmable frequency and amplitude functionalities. In some embodiments, the tone generator 1232 can produce a sinusoidal output modulated with, for example, a 2nd order cascaded integrator-comb (CIC) filtered pulse to prevent audible energy during turning on and off of the tone generator 1232.

Referring to FIGS. 10 and 11, the Rout controller 1064 can be implemented as a digital block that performs computations to determine and control the sense resistance (Rs) setting in the analog resistance network 1080. The Rout controller 1064 can also perform computations to determine a digital fine gain value that is provided to the HOR/ZOR EQ block 1142 for use in a fine gain adjustment.

Referring to FIGS. 10 and 8, the resistance network 1080 can be implemented as an analog block that includes a programmable sense resistance (Rs) network, and programmable ZOR and HOR Rout mode feedback resistances (Rz and Rh). Such a resistance network is shown to be controlled by the Rout controller 1064.

Referring to FIGS. 10 and 11, and as described above, the HOR/ZOR EQ block 1142 and its gain compute block (1212 in FIGS. 8 and 9) can provide a gain multiplier functionality where HOR digital calibration gain is applied. Such an application of the HOR digital calibration gain can be based on a control signal (HOR Cal fine gain) provided by the Rout controller 1064.

Configured in the foregoing manner, the gain calibration processor 1230 can compute a gain mismatch between HOR and ZOR modes by introducing a calibration tone (e.g., an ultrasonic tone at ~25 KHz) into the digital audio stream at the mixer 1144 before the signal limiter block 1146. The digital audio stream with the calibration tone mixed therein is passed through the signal limiter block 1146. At the output of the signal limiter block 1146, the digital audio stream is routed through path 1043 to the PWM controller (1050 in FIG. 8) to be processed and amplified by the H-bridge driver 1052 to provide an output at HPP and HPN. Also at the output of the signal limiter block 1146, the digital audio stream is obtained for the gain calibration processor 1230 as a reference signal. Thus, the magnitude and phase of the output signal at the output (HPP, HPN) can be compared relative to the magnitude and phase of the reference signal.

To achieve the foregoing comparison of the output signal (analog signal) with the reference signal (digital signal), the gain calibration ADC 1084 can sample the output voltage across the load (HPP-HPN) and provide a delta-sigma ADC output to the gain calibration processor 1230. Measurement and computation of the HOR and ZOR gains can be performed by the gain calibration processor 1230 (e.g., with a gain compute block 1236) utilizing an estimation algorithm where the reference signal X and the digitized output signal Y are downconverted with a tone at the same frequency as the calibration tone (e.g., 25 KHz). The downconverted signals X and Y can be filtered (e.g., single-bin fast Fourier transform (FFT) with a discrete Fourier transform (DFT) block 1234) to provide respective complex downconverted values x and y. A ratio of the two complex downconverted values can be obtained, where Ratio=y/x. It is noted that complex values can be utilized so that the load inductance does not significantly affect the gain calculation; however, the real component of the Ratio is utilized.

The foregoing Ratio=y/x is an expression of a transfer function gain from the digital input to the amplifier output, and can be designed to be tolerant to out-of-band interference. Ratio can be computed for each of the HOR and ZOR modes, such that Ratio(HOR)=y/x in the HOR mode, and Ratio(ZOR)=y/x in the ZOR mode.

The calibration processor 1230 can then compute another ratio Relative_HOR_gain=Ratio(HOR)/Ratio(ZOR) which is representative of the HOR gain relative to the ZOR gain. Ideally, this ratio Relative_HOR_gain has a value of 1.

Referring to FIG. 11, the computed Relative_HOR_gain value is shown to be provided to the Rout control block 1064 by the gain calibration controller 1238. Based on such a computed Relative_HOR_gain value, the Rout control block 1064 can determine an adjustment to the sense resistance (Rs) and a fine gain (HOR Cal fine gain in FIG. 10) control signal to be applied to the digital path by the gain compute block 1212 of the HOR/ZOR EQ block 1142.

More particularly, the Rout control block 1064 can obtain the Relative_HOR_gain value and perform computations to determine how to change the sense resistance (Rs) relative to its present setting. Based on the change it makes to the sense resistance (Rs) setting, the Rout control block 1064 can compute the digital fine gain adjustment needed to make the Relative_HOR_gain value to be 1.

As described herein, the audio amplifier circuit 1000 of FIG. 5 can be configured to operate in one of two modes of operation (a high output resistance (HOR) mode and a zero output resistance (ZOR) mode) to provide desired combinations of optimal performance and power-consumption. Accordingly, such an audio amplifier circuit can switch between the two modes depending on the desired tradeoff between performance and power-consumption.

During the foregoing switching between the two modes, audio artifacts (some of which may be audible) can arise from a difference in gain of the amplifier between the two modes. Such a difference in gain can result from differences in operating circuitry between the two modes, as well as other factors such as temperature variations, circuit performance variations, and/or chip-to-chip variations.

Figure 12:
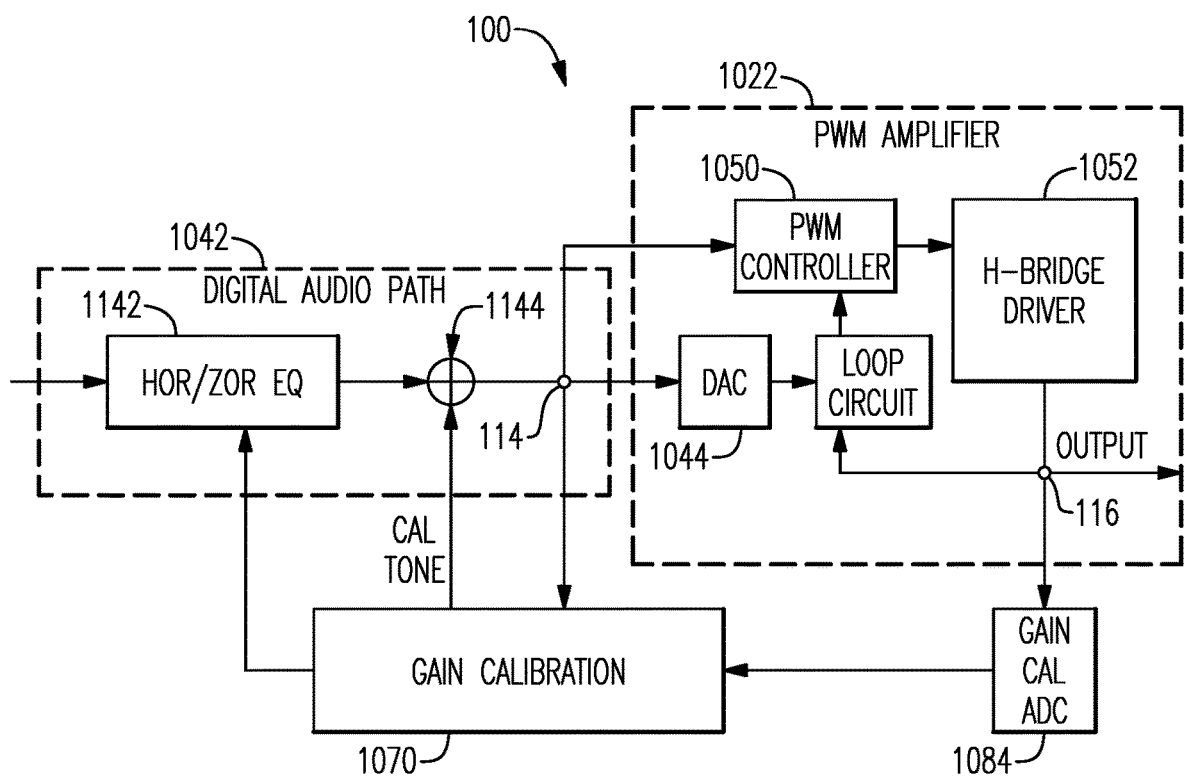
FIG. 12 shows a block diagram of a gain calibration architecture that is similar to the examples of FIGS. 10 and 11.

FIG. 12 shows a block diagram of a gain calibration architecture 100 that is similar to the examples of FIGS. 10 and 11. More particularly, in FIG. 12, the gain calibration architecture 100 is shown to include an output signal (at an output node 116) of an H-bridge driver 1052 being sampled by a gain calibration ADC 1084, and such an ADC is shown to provide a digitized signal representative of the output signal to a gain calibration block 1070. As described herein, the foregoing output signal results from amplification of a feedforward digital signal provided to a PWM controller 1050 from a node 114 in a digital audio path 1042, such that the PWM controller 1050 provides an appropriate signals to drive the H-bridge driver 1052 to thereby generate the output signal.

As shown in FIG. 12, the gain calibration block 1070 is shown to be also provided with a digital signal from the node 114. Accordingly, the digital signal from such a node of the digital audio path 1042 can be considered to be an input digital signal for the PWM amplifier 1022.

As described herein, and also shown in FIG. 12, the gain calibration block 1070 is shown to provide a calibration tone (Cal tone) to a mixer 1144, such that the input digital signal at the node 114 includes the calibration tone. Such a calibration tone can be, for example, an ultrasonic tone not audible to a listener.

As described herein, and also shown in FIG. 12, the gain calibration block 1070 is shown to provide a control signal to a HOR/ZOR EQ block 1142 to adjust the input digital signal based on a gain calibration computation determined by the gain calibration block 1070. The HOR/ZOR EQ block 1142 can then provide a gain-adjusted input digital signal to the input node 114 through the mixer 1144.

In the example of FIG. 12, the gain calibration block 1070 samples both of the input signal (from the node 114) and the output signal (from the node 116). It is noted that if only an output signal is sampled by a gain calibration scheme, it is possible to measure the output signal at the frequency of a calibration tone signal for each of HOR and ZOR modes, thereby allowing determination of the difference in the levels of the output signals between the two modes. However, such a scheme relies on an assumption that the input signal being amplified does not include any of content in the frequency of the calibration tone signal. If the input signal has any significant energy at or around the frequency of the calibration tone signal, such portion of the input signal will affect the output level too, thereby making the comparison of signal levels between the two modes meaningless or less useful.

Figure 13:
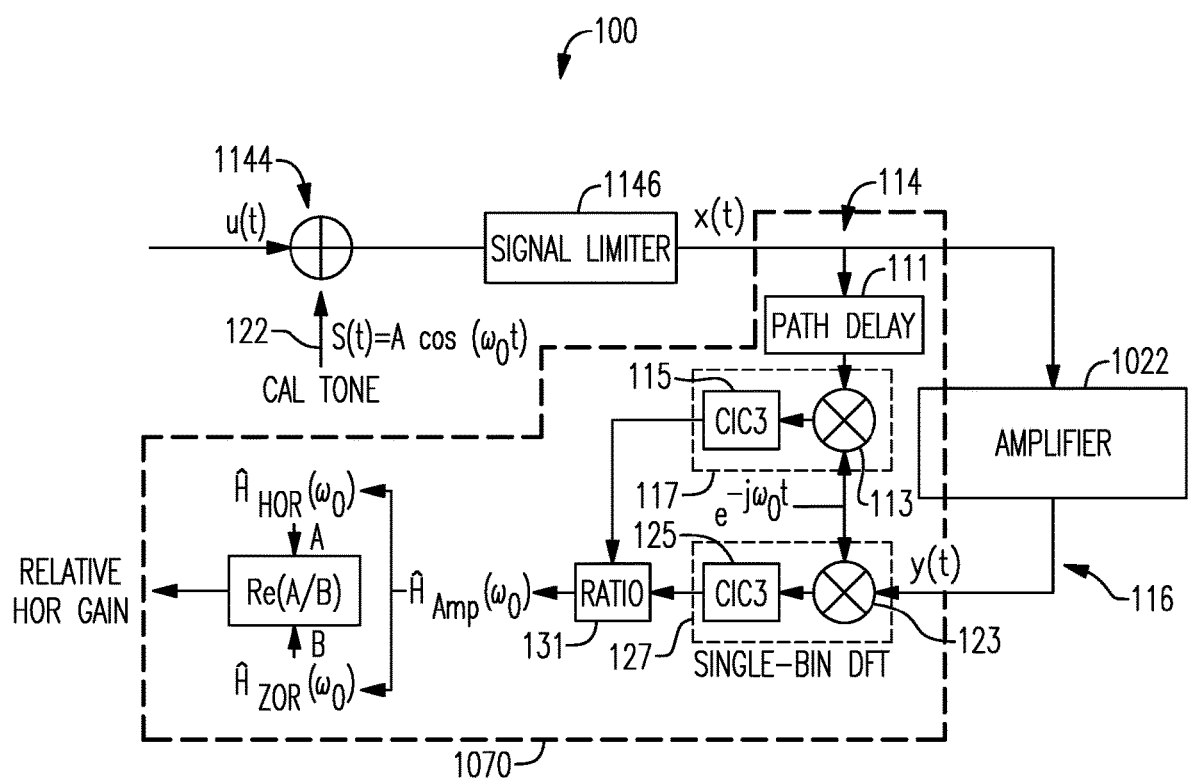
FIG. 13 shows a gain calibration architecture that can be implemented as a more specific example architecture of FIG. 12.

FIG. 13 shows that in some embodiments, the gain calibration architecture 100 of FIG. 12 can be implemented as a more specific example architecture 100. In FIG. 13, the gain calibration architecture 100 is shown to include a gain calibration block generally indicated as 1070. Such a gain calibration block is shown to sample an input digital signal at an input node 114 for a PWM amplifier 1022 and an output signal at an output node 116 of the PWM amplifier 1022. In FIG. 13, the input node 114 is shown to be after a signal limiter 1146, similar to the example of FIGS. 10 and 11.

As also described in reference to FIGS. 10 and 11, and as also shown in FIG. 13, a calibration tone (Cal tone) 122 is shown to be generated by the gain calibration block 1070 and provided to a mixer 1144 where the calibration tone is mixed with an input digital signal. As described herein, such a calibration tone can be, for example, an ultrasonic tone having a frequency of approximately 25 KHz.

Referring to FIG. 13, the gain calibration block 1070 can be configured to compute a gain mismatch between HOR and ZOR modes by injecting the ultrasonic calibration tone 122 into the digital audio stream and measuring its relative magnitude and phase at the output 116 of the amplifier 1022 (with respect to the input 114 of the amplifier 1022). As shown in FIG. 12, a calibration ADC 1084 samples the output voltage across the load. As shown in FIG. 13, the input digital signal can be sampled as a reference measurement at the input 114 of the amplifier 1022.

In some embodiments, for gain calibration purpose, signal energy near the tone frequency can be removed or sufficiently reduced for the input digital signal (without the calibration tone) and the output signal (without the calibration tone), so that such signal energy does not affect gain ratios when calibration tone is utilized. For example, a demodulated calibration ADC output can be divided by a demodulated reference (input) signal to reject the host audio energy that may be present near the tone frequency.

In some embodiments, measurement and computation of relative HOR mode gain can be implemented inside the gain calibration block 1070 utilizing an algorithm disclosed herein. For example, a measurement can be triggered on detection of a 'gcc_start_cal' pulse from a gain calibration controller (GCC) block (1238 in FIG. 11). A relative HOR gain computed in the gain calibration block 1070 can be used by a resistance control block (1064 in FIG. 11) to apply a gain adjustment via a coarse gain (e.g., applied in the analog path) and a fine gain (e.g., applied in the digital path).

Referring to FIG. 13, the example algorithm can include an ultrasonic calibration tone (Cal tone having a frequency $\omega_0$) being injected in the digital audio path. A frequency response of the analog subsystem associated with the amplifier 1022 and the ADC (1084 in FIG. 12) can be estimated by taking the ratio of a discrete Fourier transform (DFT) of its output to that of its input to provide a transfer function of $$\hat{H}_{Amp}(\omega_0) = \frac{Y(\omega_0)}{X(\omega_0)} = \frac{X(\omega_0)e^{-j\omega_0\tau}H_{Amp}(\omega_0)H_{ADC}(\omega_0)}{e^{-j\omega_0\hat{\tau}}X(\omega_0)} = e^{-j\omega_0(\tau-\hat{\tau})}H_{Amp}(\omega_0)H_{ADC}(\omega_0) \quad (1)$$

where $Y(\omega_0)$ and $X(\omega_0)$ are representative of the output and input, respectively. With the analog subsystem being represented by a lumped system model $e^{-j\omega_0\tau}H_{Amp}(\omega_0)H_{ADC}(\omega_0)$, the output can be represented as $Y(\omega_0)=X(\omega_0)e^{-j\omega_0\tau}H_{Amp}(\omega_0)H_{ADC}(\omega_0)$, and the input can be represented as $X(\omega_0)=e^{-j\omega_0\hat{\tau}}X(\omega_0)$, to thereby arrive at the expression for the ratio $$\frac{Y(\omega_0)}{X(\omega_0)}$$

on the right side of Equation 1.

In some embodiments, sampling of the input and output signals at the calibration tone frequency ($\omega_0$) can be achieved by a discrete Fourier transform (DFT) of each of the input and output signals at a single frequency which coincides substantially with the calibration tone frequency ($\omega_0$). In FIG. 13, such a single-bin DFT is indicated as 115 for the input signal from the input node 114, and as 117 for the output signal from the output node 116.

In some embodiments, each of the single-bin DFTs (117, 127) can be implemented to include a lowpass filter that is provided with a product of the respective signal and a complex sinusoid ($e^{-j\omega_0 t}$) having the calibration tone frequency ($\omega_0$). In the example of FIG. 13, the single-bin DFT (117) sampling of the input signal is shown to be achieved by providing a sampling path, from the input node 114, having a path delay (indicated as 111), such that the time-delayed input signal is multiplied with the complex sinusoid ($e^{-j\omega_0 t}$) by a multiplier 113. The product from the multiplier 113 is shown to be provided to a lowpass filter 115. Similarly, the single-bin DFT (127) sampling of the output signal is shown to be achieved by providing a sampling path, from the output node 116, such that the time-delayed output signal is multiplied with the complex sinusoid ($e^{-j\omega_0 t}$) by a multiplier 123. The product from the multiplier 123 is shown to be provided to a lowpass filter 125.

FIG. 13 shows that in some embodiments, each of the lowpass filters 115, 125 can be implemented as a cascaded integrator comb (CIC) filter such as a 3rd-order CIC (CIC3) filter. Examples related to such CIC filters are described herein in greater detail.

In the example of FIG. 13, the lowpass filter 115 provides a single-bin DFT signal $X(\omega_0)$ representative of the output signal, and the lowpass filter 125 provides a single-bin DFT signal $Y(\omega_0)$ representative of the input signal. Such signals from the respective lowpass filters 115, 117 are shown to be provided to a block 131 that computes a ratio $$\frac{Y(\omega_0)}{X(\omega_0)}$$

to provide a transfer function $\hat{H}_{Amp}(\omega_0)$.

Referring to FIG. 13, the transfer function $\hat{H}_{Amp}(\omega_0)$ can be obtained for each of the HOR and ZOR modes as $\hat{H}_{HOR}(\omega_0)$ and $\hat{H}_{ZOR}(\omega_0)$, respectively, and such transfer functions ($\hat{H}_{HOR}(\omega_0)$ and $\hat{H}_{ZOR}(\omega_0)$) can be compared to estimate a relative gain difference between the two modes. For example, a ratio of ($\hat{H}_{HOR}(\omega_0)$) and $\hat{H}_{ZOR}(\omega_0)$) can be obtained, such that Gain=$\hat{H}_{HOR}(\omega_0)/\hat{H}_{ZOR}(\omega_0)$.

FIG. 13 shows that in some embodiments, the real part of the ratio of the transfer function in the two modes can be obtained, where such a real part represents the DC gain ratio between the two modes. In FIG. 13, such a real part is indicated as Re(A/B), where A/B is the foregoing gain $\hat{H}_{HOR}(\omega_0)/\hat{H}_{ZOR}(\omega_0)$. It is noted that the imaginary part of the complex ratio $\hat{H}_{HOR}(\omega_0)/\hat{H}_{ZOR}(\omega_0)$ depends on an inductance of the load and can be frequency dependent.

In some embodiments, the ratio of the two gains $$\left(\text{Gain} = \frac{\hat{H}_{HOR}(\omega_0)}{\hat{H}_{ZOR}(\omega_0)}\right)$$

can be provided as an output for a coarse gain adjustment by the resistance control block (1080 in FIG. 10) and a fine gain adjustment by the HOR/ZOR EQ block (1142 in FIG. 10).

In some embodiments, in the foregoing gain calibration technique, each of the lowpass filters 115, 125 can be implemented with six CIC filters (or 3 complex ones). In the example context of each lowpass filter being implemented as a CIC3 filter, each of the CIC3 filters can include three accumulators. Such accumulators can have a large bit-width (e.g., 64 bits) due to a potentially large decimation ratio.

Figure 14A:
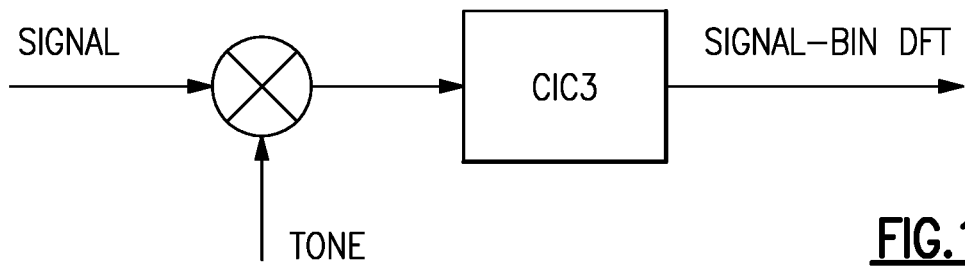
FIGS. 14A to 14C show examples of how discrete Fourier transform computation can be achieved to provide a desired effect.
Figure 14B:
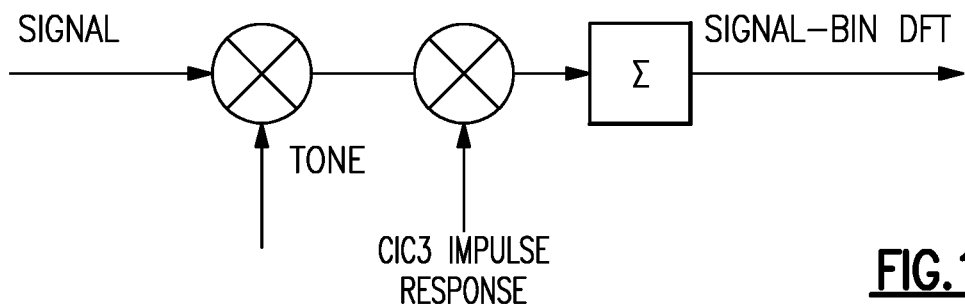
Figure 14C:
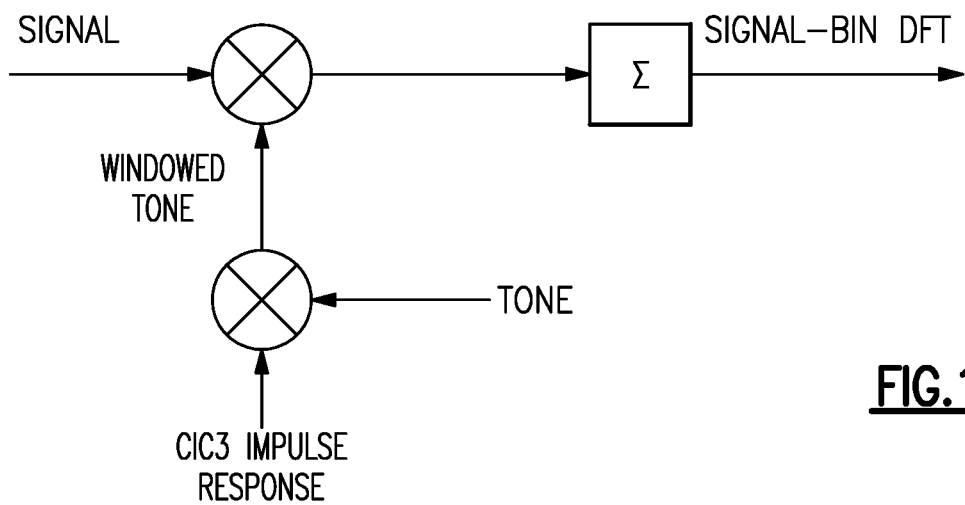

FIGS. 14A to 14C show examples of how DFT computation can be achieved to provide a desired effect. Referring to FIG. 14A, a signal and a tone are shown to be multiplied by a multiplier, and the product is shown to be provided to a CIC3 filter to generate an impulse response as a single-bin DFT output. Such a CIC filter can be the CIC3 filter 115 or the CIC3 filter 125 of FIG. 13. For the former (CIC3 filter 115), the signal is the input signal, and the multiplier is 113 in FIG. 13, with the tone being a complex sinusoid tone (indicated as $e^{-j\omega_0 t}$ signal in FIG. 13). For the latter (CIC3 filter 125), the signal is the output signal, and the multiplier is 123 in FIG. 13, with the tone being the same complex sinusoid tone.

FIG. 14B shows that in some embodiments, the impulse response from the CIC3 (CIC3 impulse response) described above in reference to FIG. 14A can be multiplied with a product of signal and tone (multiplied by a multiplier similar to FIG. 14A) to generate a product that is provided to an assembly of accumulator(s). Such an assembly of accumulator(s) then provides a single-bin DFT output.

FIG. 14C shows that in some embodiments, the impulse response from the CIC3 (CIC3 impulse response) described above in reference to FIG. 14A can be pre-multiplied with a tone (complex sinusoid) to generate a windowed tone. Such a windowed tone is shown to be multiplied with a signal by a multiplier similar to generate a product that is provided to an assembly of accumulator(s). Such an assembly of accumulator(s) then provides a single-bin DFT output.

In some embodiments, a windowing technique can be applied to the measurement tone (e.g., as in the example of FIG. 14C) to make it inaudible by preventing sidelobe leakage into the audio band. As described in reference to FIG. 14C, pre-multiplying the tone with the CIC3 impulse response can provide a desirable tone ramp up/down and simplify the CIC3 filter implementation to a single accumulator.

In some embodiments, duration of the foregoing tone can be controlled by, for example, an 18-bit programmable register which specifies the number of samples divided by 3. The example division by 3 is for ease of implementation of CIC3 impulse response.

Figure 15:
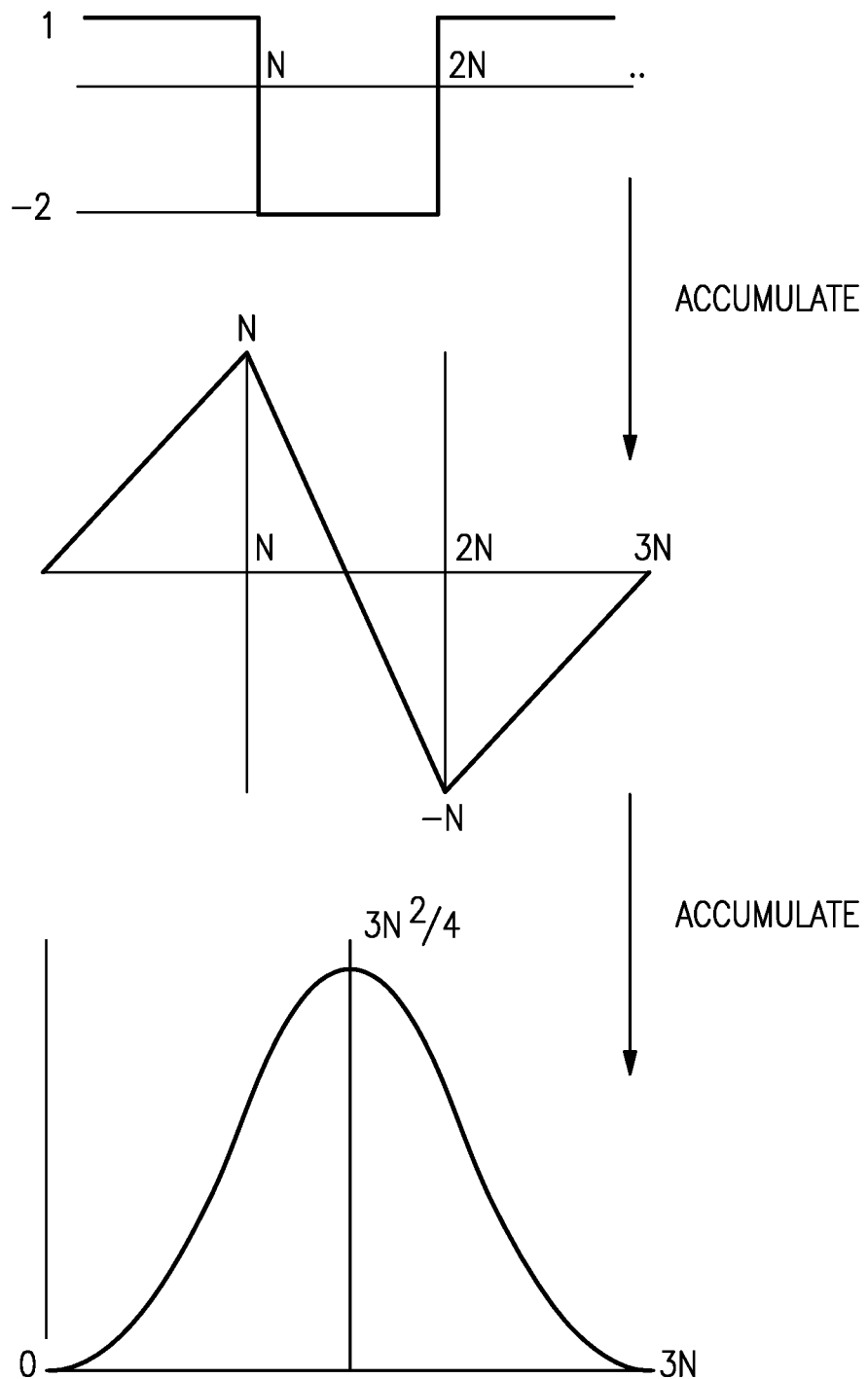
FIG. 15 shows an example of a windowing process that can be applied to a calibration tone signal.

FIG. 15 shows an example of a windowing process that can be applied to the measurement tone described above. In the example of FIG. 15, a 3rd order window is generated by a window circuit configured as a sinc3 window generator. Additional details concerning such an example window are described herein.

In some embodiments, a calibration cycle can include some or all of the following operations: (1) Injecting of an ultrasonic calibration tone having an amplitude, frequency, and duration; (2) Enabling, for the duration of the calibration tone, an ADC that digitizes the PWM amplifier output and sends the digitized signal back to the gain calibration block; (3) also routing a copy of the signal going to the amplifier (including the input signal and the calibration tone) to the gain calibration block; (4) computing a single-frequency DFT (at the calibration tone frequency) of the PWM amplifier output signal and computing a single-frequency DFT (at the calibration tone frequency) of the PWM amplifier input signal in parallel; and (5) saving the ratio of the two single-frequency DFTs (DFT of the PWM amplifier output to DFT of the amplifier input) as a transfer function (TF), with the TF being TF_HOR if the calibration cycle was performed in the HOR mode, or TF_ZOR if the calibration cycle was performed in the ZOR mode.

It is noted that the transfer function described above is generally immune to the presence of ultrasonic energy in the input signal. In fact, any energy around the calibration tone frequency in the input signal acts substantially the same as the calibration tone and can provide an enhanced measurement. In contrast, such an energy around the calibration tone frequency acts as an interferer for a calibration configuration where only the amplifier output level is being measured for calibration.

In some embodiments, a gain calibration algorithm can include some or all of the following: (1) A calibration cycle can be performed if a programmable time interval has passed. There may be parallel timers for HOR mode and ZOR mode. If sufficient time has passed since a successful calibration cycle in HOR mode, a new HOR mode calibration cycle can be implemented as soon as the audio amplifier enters HOR mode. The same can be achieved for ZOR mode as well. (2) At the end of each successful calibration cycle, a ratio of saved TF_HOR and TF_ZOR can be computed. (3) The foregoing ratio can be further transformed by a programmable multiplicative correction factor followed by a programmable additive correction factor. The real part of the final result can be treated as an effective relative HOR gain of the system (e.g., HOR mode gain when treating the ZOR mode gain as unit gain). Multiplicative and additive correction factors can be utilized to compensate for any systematic bias in the estimation process. By default, the multiplicative correction factor can be set to 1, and the additive correction factor can be set to 0, so as to not have any effect.

For the purpose of description, let u(n), v(n), x(n) and y(n) represent the n-th samples of the digital input signal, calibration tone, amplifier input signal and amplifier output signal, respectively. If the duration of the calibration tone is N samples, then n can range from 0 to N−1. Then, v(n) can be expressed as v(n)=A*w(n)* cos(2*pi*f*n/Fs), where A is a programmable tone amplitude, f is a programmable calibration tone frequency, Fs is a sample rate (e.g., 3.072 MHz), and w(n) is a window function to fade in and out the calibration tone smoothly, since a sudden start/stop might produce an audible pop. In some embodiments, the window function w(n) can be one of defined window functions. For example, the window function can be an impulse response of a third-order CIC filter. In such a configuration, a window function can be generated on the fly easily without the need for storing the window shape.

It is noted that $x(n)=u(n)+v(n)$, DFT_X=sum_over_n $(x(n)*w(n)* (\cos(2*pi*f*n/Fs)+1i*\sin(2*pi*f*n/Fs)))$, and DFT_Y=sum_over_n $(y(n)*w(n)* (\cos(2*pi*f*n/Fs)+1i*\sin(2*pi*f*n/Fs)))$, where w(n) represents a window function to limit sidelobe leakage. In some embodiments, a window function may or may not be utilized. Use of the window function based on the same CIC3 window described above can be beneficial to fade in/out the cal tone.

It is noted that TF_xOR=DFT_Y/DFT_X, where x is "H" for HOR or "Z" for ZOR. Thus, the ratio TF_xOR can be either TF_HOR or TF_ZOR depending on which mode the calibration cycle was performed in.

It is noted that CORR_MUL (complex-valued) and CORR_ADD (real-valued) can be programmable correction factors. Then, the final output (relative HOR gain) can be given by Relative_HOR_gain=real(CORR_MUL*TF_HOR/TF_ZOR)+CORR_ADD.

In some embodiments, some or all of the following additional features can be implemented. For example, a calibration cycle can be aborted and not marked successful (or as not have happened) in the following events: (1) There is a mode transition during the calibration cycle. (2) The magnitude of the DFT of the analog amplifier input signal is lower than a threshold. This is to protect against a very unlikely case that the calibration tone and digital input signal cancelled each other out very well at the calibration tone frequency. (3) The magnitude of the DFT of the amplifier input signal (same as above) is above a certain threshold. This is to protect against making measurements when some analog parts of the amplifier may be in significant non-linear mode of operation.

In another example, the right hand side of the above-referenced DFT computation can contain the calibration tone.

In yet another example, some or all of the frequency, amplitude, and duration of calibration tone can be programmable. It is noted that a programmable frequency provides an ability to change the location of the calibration tone to avoid any problematic part of the spectrum in a product. It is also noted that a higher tone level can result in more accurate estimate, but can also consume more power and would be more likely to push analog into a non-linear mode. It is also noted that a longer duration can also make the estimates more accurate.

In yet another example, a boot calibration process can be implemented as part of a boot up sequence, before any input audio is processed. HOR and ZOR cal cycles can be performed to start the chip with a good estimated of relative HOR gain.

In yet another example, an ADC nonlinearity correction can be applied. The ADC used to digitize the amplifier output for the calibration process can suffer from some nonlinearity. Such an effect can be corrected by modifying the equation for x(n) as follows: $x(n)=u(n)+v(n)+k*d(n)$, where d(n) is an estimate of the non-linearity produced by the ADC. This is estimated by another part of the design (e.g., PWM controller) and routed to the gain calibration block. The quantity k is a parameter stored in, for example, an OTP memory as part of a calibration process during ATE testing of the chip.

As described above, a window circuit can be implemented with a gain calibration circuit to provide a windowing functionality for the calibration circuit. It is noted that a windowing technique can be utilized to process a signal to, for example, reduce a sidelobe leakage during a Fourier transform process such as a DFT or FFT, and/or smoothly fade in and out a signal without creating a large discontinuity (or an audible artifact such as a "pop" noise). In some embodiments, such a window can be configured to provide sufficient sidelobe attenuation for a signal being windowed.

In some embodiments, a window having one or more features as described herein can be generated without evaluating complicated functions. In some embodiments, a window having one or more features as described herein can be implemented without having to retrieve a saved window configuration that was previously generated.

In some embodiments, a window circuit can include a sinc function based window that allows generation of a desired window on-the-fly (e.g., while the window circuit is in operation) with an efficient hardware implementation. Such a window can provide desirable features such a high sidelobe attenuation, large length if needed or desired, and be configured with relatively simple logic circuits such as a few adders.

It is noted that when a signal that is windowed by the foregoing sinc function based window circuit undergoes a Fourier transform, the resulting transform can be represented by one or more powers of the sinc function. For example, a sinc3 window results in a Fourier transform being a third power of the sinc function. Similarly, a sinc4 window results in a Fourier transform being a fourth power of the sinc function. In some embodiments, a higher order sinc window configuration can provide more sidelobe attenuation.

Figure 16:
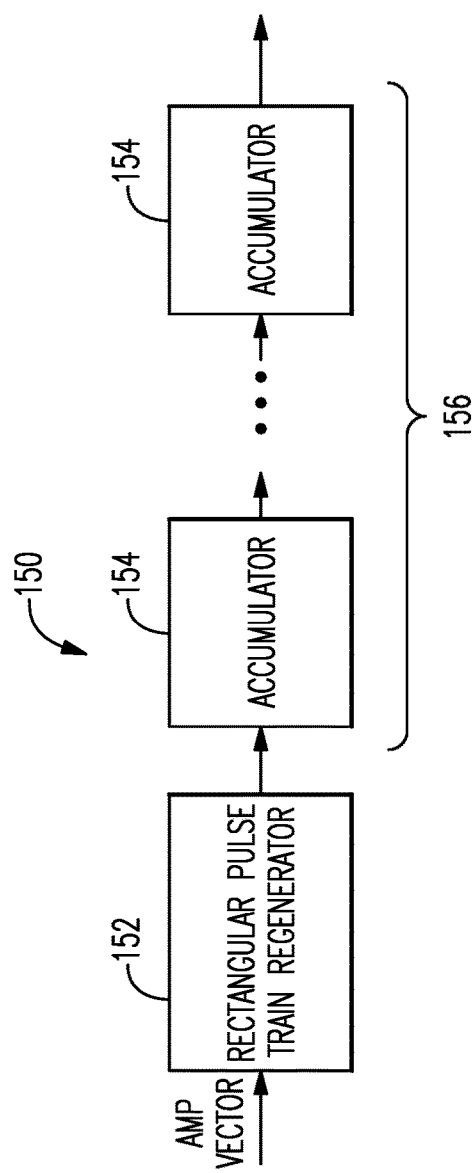
FIG. 16 shows a block diagram of a window circuit that can provide windowing functionality, including sinc function based windowing functionality.

FIG. 16 shows a block diagram of a window circuit 150 that can provide the foregoing functionality, including the sinc function based windowing functionality. The window circuit 150 is shown to include a pulse train generator 152 configured to generate a sequence of M rectangular pulses based on an amplitude vector, for an M-th order window. Each pulse can be L samples wide if the total desired window duration is to be L×M samples. The amplitude of each pulse (for all L samples within it) can be provided as a value in the input amplitude vector. In some embodiments, such an amplitude vector can include M values that are specified in, for example, a table such as a lookup table.

Referring to FIG. 16, the pulse train generated by the generator block 152 can be fed to a chain (156) of M−1 accumulators 154. In some embodiments, the output of the last accumulator of the chain 156 can be utilized as a desired window having a width of L×M samples.

Figure 17:
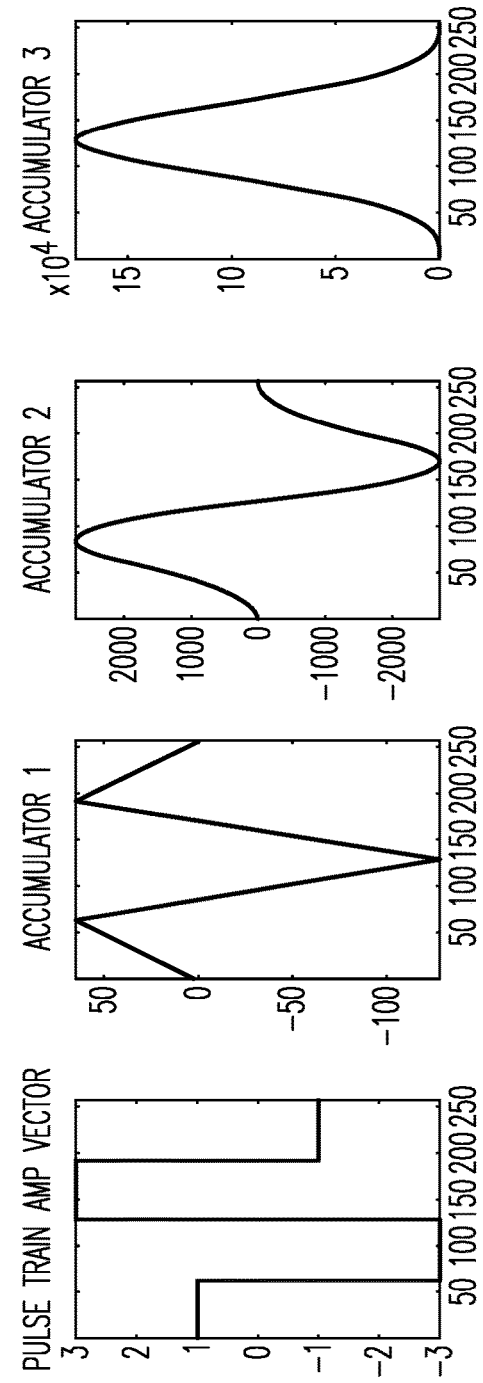
FIG. 17 shows an example of a 4-th order window generated by the window circuit of FIG. 16 configured as a sinc4 window generator.

FIG. 17 shows an example of a 4-th order window generated by the window circuit 150 of FIG. 16 configured as a sinc4 window generator. In such a configuration, M=4, and suppose that each rectangular pulse has a width of L=64 samples. Then, the resulting sinc4 window has a length of M×L=256 samples.

Referring to the example of FIG. 17, the left-most panel shows an output of the rectangular pulse train generator 152 of FIG. 16, with an initial amplitude being specified to be 1. The chain 156 of accumulators includes three accumulators 154 since M−1=3. Thus, an output of the first accumulator is shown in the panel indicated as Accumulator 1; an output of the second accumulator is shown in the panel indicated as Accumulator 2; and an output of the third accumulator is shown in the panel indicated as Accumulator 3.

In the example of FIG. 17, the output of the third accumulator (Accumulator 3) can be utilized as a desired window of the sinc4 window.

It is noted that in the example of FIG. 15 described herein, the example window is a 3rd order window that can be generated by the window circuit 150 of FIG. 16 configured as a sinc3 window generator. In such an example configuration, M=3, and each rectangular pulse has a width of L.

Referring to the example of FIG. 15, the top panel shows an output of the rectangular pulse train generator 152 of FIG. 16, with an initial amplitude being specified to be 1. The chain 156 of accumulators includes two accumulators 154 since M−1=2. Thus, an output of the first accumulator is shown in the middle panel, and an output of the second accumulator is shown in the bottom panel.

In the example of FIG. 15, the output of the second accumulator can be utilized as a desired window of the sinc3 window.

In some embodiments, a window generated by the window circuit 150 of FIG. 16 can be normalized with respect to some or all of the following. For example, a window can be scales such that its peak is approximately 1. In another example, a window can be scaled such that the sum of all samples is approximately 1. In yet another example, a window can be scaled such that its RMS of all samples is approximately 1.

It is noted that the window circuit configured to provide sinc function based windows can provide efficient normalization, including some or all of the foregoing normalization examples, by scaling few samples in an amplitude vector that controls the amplitudes of the rectangular pulse train. For example, an amplitude vector can be scaled such that the peak output of the final accumulator is a power of 2. In such a configuration, the final output can be shifted (e.g., right-shifted) to normalize the peak to be approximately 1.

Table 1 lists examples of amplitude vectors, for various example orders, that can be provided to the rectangular pulse train generator 152 of the window circuit 150 of FIG. 16. For example, the amplitude vector for the 3rd order is shown to provide the amplitudes in the rectangular pulse train in the example of FIG. 15. In another example, the amplitude vector for the 4th order is shown to provide the amplitudes in the rectangular pulse train in the example of FIG. 17.

TABLE 1

| Order | Rectangular pulse train amplitude vector | | | | | | | | |
|---|---|---|---|---|---|---|---|---|---|
| 2  | 1 | −1 |    |     |      |     |     |   |    |
| 3  | 1 | −2 | 1  |     |      |     |     |   |    |
| 4  | 1 | −3 | 3  | −1  |      |     |     |   |    |
| 5  | 1 | −4 | 6  | −4  | 1    |     |     |   |    |
| 6  | 1 | −5 | 10 | −10 | 5    | −1  |     |   |    |
| 7  | 1 | −6 | 15 | −20 | 15   | −6  | 1   |   |    |
| 8  | 1 | −7 | 21 | −35 | 35   | −21 | 7   | −1 |   |
| 9  | 1 | −8 | 28 | −56 | 70   | −56 | 28  | −8 | 1 |
| 10 | 1 | −9 | 36 | −84 | 126  | −126| 84  | −36 | 9 | −1 |

Referring to Table 1, it is noted that in some embodiments, an amplitude vector ($Amp_M(i)$, i=1 to M)) for generating an M-th order window can be obtained by setting $Amp_M(1)=1$, and $Amp_M(i)=Amp_{M-1}(i)-Amp_{M-1}(i-1)$, where $Amp_{M-1}$ is the amplitude vector for the M−1 order window, and $Amp_{M-1}(i)=0$ for i>M.

Thus, and by way of example, Table 2 lists the same amplitude vectors as in the example of Table 1, but in which an M-th order array can be provided with zeros for at least the i=M+1 element. In the example of Table 2, an M-th order array is shown to be provided with zeros for elements having i>M.

TABLE 2

| Order | Rectangular pulse train amplitude vector | | | | | | | | |
|---|---|---|---|---|---|---|---|---|---|
| 2  | 1 | −1 | 0  | 0   | 0    | 0   | 0   | 0  | 0 |
| 3  | 1 | −2 | 1  | 0   | 0    | 0   | 0   | 0  | 0 |
| 4  | 1 | −3 | 3  | −1  | 0    | 0   | 0   | 0  | 0 |
| 5  | 1 | −4 | 6  | −4  | 1    | 0   | 0   | 0  | 0 |
| 6  | 1 | −5 | 10 | −10 | 5    | −1  | 0   | 0  | 0 |
| 7  | 1 | −6 | 15 | −20 | 15   | −6  | 1   | 0  | 0 |
| 8  | 1 | −7 | 21 | −35 | 35   | −21 | 7   | −1 | 0 |
| 9  | 1 | −8 | 28 | −56 | 70   | −56 | 28  | −8 | 1 | 0 |
| 10 | 1 | −9 | 36 | −84 | 126  | −126| 84  | −36 | 9 | −1 |

Thus, for example, the 3rd order amplitude vector listed in Table 2 can be generated as follows: $Amp_3(1)=1$, $Amp_3(2)=Amp_2(2)-Amp_2(1)=-1-1=-2$, and $Amp_3(3)=Amp_2(3)-Amp_2(2)=0-(-1)=+1$.

Similarly, the 4th order amplitude vector listed in Table 2 can be generated as follows: $Amp_4(1)=1$, $Amp_4(2)=Amp_3(2)-Amp_3(1)=-1-1=-3$, $Amp_4(3)=Amp_3(3)-Amp_3(2)=1-(-2)=+3$, and $Amp_4(4)=Amp_3(4)-Amp_3(3)=0-1=-1$.

Referring to the example of Table 2, it is noted that the foregoing scheme of obtaining the value of an i-th element of an M-th order vector by a difference between successive terms of the (M−1)-th order vector can be generalized to include the first element, instead of the first element being specified as having a value of 1 (i.e., $Amp_M(1)=1$), if one assumes that the value of $Amp_{M-1}(i)=0$ if i=1. Thus, $Amp_3(1)$ can be calculated as $Amp_3(1)=Amp_2(1)-Amp_2(i<1)=1-0=1$. Similarly, $Amp_4(1)$ can be calculated as $Amp_4(1)=Amp_3(1)-Amp_3(i<1)=1-0=1$.

In some embodiments, a window circuit can be configured to generate an M-th order window by retrieving stored values for a respective amplitude vector (such as the vector values of Table 2), by generating values for a respective amplitude vector on-the-fly in a recursive manner, or some combination thereof.

Figure 18A:
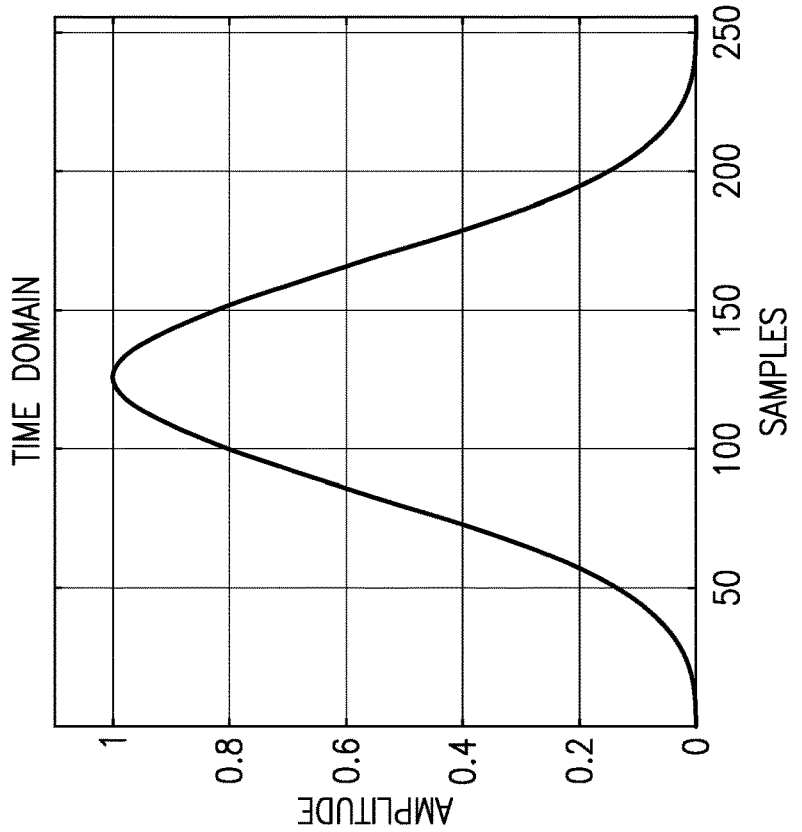
FIGS. 18A and 18B show an example of a 4th order window in time domain and in frequency domain, generated by the window circuit of FIGS. 16 and 17.
Figure 18B:
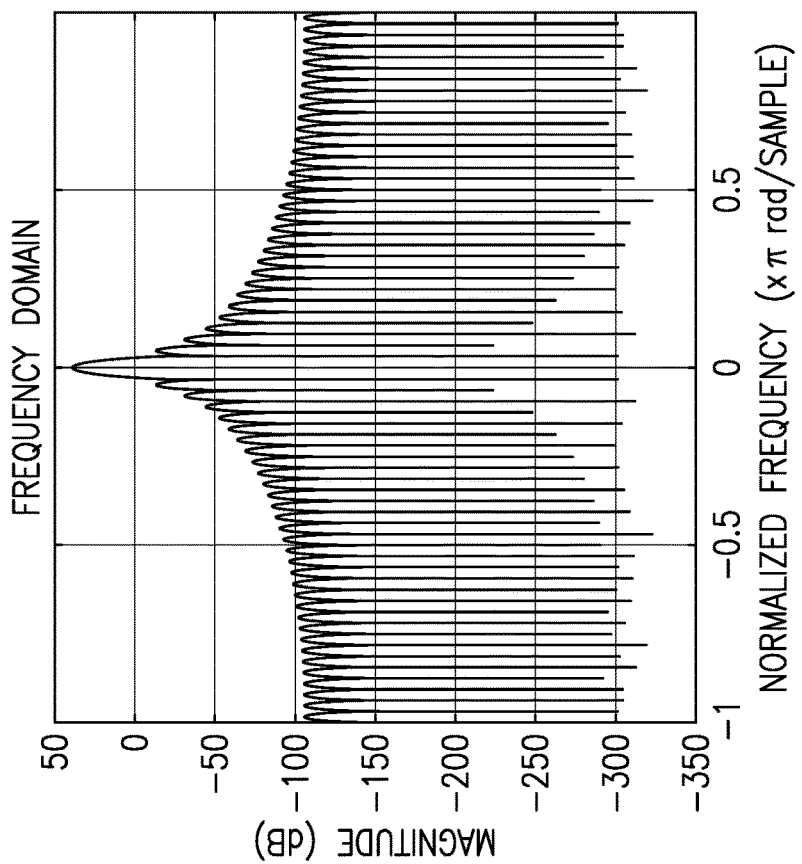

FIG. 18A shows an example of a 4th order window in time domain, and FIG. 18B shows the same window in frequency domain, generated by the window circuit of FIGS. 16 and 17.

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A calibration circuit for an audio amplification system, comprising:
    a tone generator configured to provide a tone having a frequency to an input path of an audio amplifier, such that an input signal provided to the audio amplifier includes the tone;
    a first sampling circuit configured to sample an output signal at an output node of the audio amplifier;

a second sampling circuit configured to sample the input signal at an input node of the audio amplifier; and a gain adjustment circuit configured to generate a correction signal based on the sampled output signal and the sampled input signal to correct for a gain variation of the audio amplifier.

2. The calibration circuit of claim 1 wherein the tone generator is configured to provide a window for the tone, the window configured to reduce a sidelobe leakage of the tone into an audio band.

3. The calibration circuit of claim 2 wherein the window is based on a window function capable of being generated without relying on a stored window shape, while the tone generator is in operation to provide the tone.

4. The calibration circuit of claim 1 wherein each of the first and second sampling circuit includes a discrete Fourier transform (DFT) circuit.

5. The calibration circuit of claim 4 wherein the DFT circuit is configured as a single-bin DFT circuit, the single bin having a frequency range that includes the frequency of the tone, such that the single-bin DFT circuit of the first sampling circuit generates a first transfer function DFT_Y, and the single-bin DFT circuit of the second sampling circuit generates a second transfer function DFT_X.

6. The calibration circuit of claim 5 wherein the gain adjustment circuit is configured to obtain a ratio TF=DFT_Y/DFT_X.

7. The calibration circuit of claim 6 wherein the audio amplifier is configured to operate in a high output resistance (HOR) mode or a zero output resistance (ZOR) mode.

8. The calibration circuit of claim 7 wherein the gain adjustment circuit is configured to obtain the ratio TF for the HOR mode or the ZOR mode, such that TF=TF_HOR for the HOR mode or TF_ZOR for the ZOR mode.

9. The calibration circuit of claim 1 wherein the output signal is a driving signal for driving a load.

10. The calibration circuit of claim 9 wherein the load includes a speaker.

11. The calibration circuit of claim 9 wherein the second sampling circuit includes an analog-to-digital converter (ADC).

12. The calibration circuit of claim 1 wherein the input signal is a digital signal representative of a signal received through a receiver circuit.

13. An audio amplification system comprising:

a digital audio path configured to provide a digital signal;

an audio amplifier configured to receive the digital signal as an input signal and generate an output signal; and a calibration circuit including a tone generator configured to inject a tone having a frequency to the digital audio path, such that the input signal includes the tone, the calibration circuit further including a first sampling circuit configured to sample the output signal at an output node of the audio amplifier, and a second sampling circuit configured to sample the input signal at an input node of the audio amplifier, the calibration circuit further including a gain adjustment circuit configured to generate a correction signal based on the sampled output signal and the sampled input signal to correct for a gain variation of the audio amplifier.

14. A wireless device comprising:

an antenna for receiving a wireless signal;

a digital audio path configured to provide a digital signal representative of the wireless signal;

an audio amplifier configured to receive the digital signal as an input signal and generate an output signal; and a calibration circuit including a tone generator configured to inject a tone having a frequency to the digital audio path, such that the input signal includes the tone, the calibration circuit further including a first sampling circuit configured to sample the output signal at an output node of the audio amplifier, and a second sampling circuit configured to sample the input signal at an input node of the audio amplifier, the calibration circuit further including a gain adjustment circuit configured to generate a correction signal based on the sampled output signal and the sampled input signal to correct for a gain variation of the audio amplifier.

15. The wireless device of claim 14 further comprising a speaker in communication with the audio amplifier and configured to generate sound waves based on the output signal.

16. The wireless device of claim 14 wherein the wireless device is a wireless headphone or a wireless earphone.

* * * * *